US012117868B2

(12) United States Patent
Kim et al.

(10) Patent No.: US 12,117,868 B2
(45) Date of Patent: Oct. 15, 2024

(54) DISPLAY DEVICE, MANUFACTURING METHOD THEREOF, AND MANUFACTURING APPARATUS THEREOF

(71) Applicant: Samsung Display Co., LTD., Yongin-si (KR)

(72) Inventors: Youngkwan Kim, Seoul (KR); Bohyuk Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/116,240

(22) Filed: Mar. 1, 2023

(65) Prior Publication Data
US 2023/0205262 A1 Jun. 29, 2023

Related U.S. Application Data

(63) Continuation of application No. 17/075,648, filed on Oct. 20, 2020, now Pat. No. 11,609,602.

(30) Foreign Application Priority Data

Oct. 29, 2019 (KR) .................. 10-2019-0135818

(51) Int. Cl.
*G06F 1/16* (2006.01)
*H10K 50/84* (2023.01)
(Continued)

(52) U.S. Cl.
CPC ......... *G06F 1/1609* (2013.01); *H10K 50/841* (2023.02); *H10K 50/8426* (2023.02); *G06F 1/1637* (2013.01); *H10K 71/00* (2023.02)

(58) Field of Classification Search
CPC . H01L 2251/56; H01L 23/544; H01L 21/682; H01L 21/67282; H01L 21/187;
(Continued)

(56) References Cited

U.S. PATENT DOCUMENTS 6,307,613 B1 * 10/2001 Lida .................. G02F 1/133528
349/110
7,255,147 B2 8/2007 Lee et al.
(Continued)

FOREIGN PATENT DOCUMENTS

KR 20020005400 1/2002
KR 1020030075228 A 9/2003
(Continued)

OTHER PUBLICATIONS

Notice of Allowance issued Nov. 21, 2022, in U.S. Appl. No. 17/075,648.

*Primary Examiner* — Mariam Qureshi
(74) *Attorney, Agent, or Firm* — CANTOR COLBURN LLP

(57) ABSTRACT

A method for manufacturing a display device includes the steps of: providing a first display panel including a first indicia and a second indicia; disposing a first window including a third indicia on the first display panel; identifying a position of the first indicia and a position of the third indicia; aligning the first display panel and the first window using the positions of the first and third indicia; coupling the first window and the first display panel to each other; identifying a coupled position defined by positions of the second and third indicia of the first display panel and the first window; correcting a position of a second display panel or a position of a second window based on the coupled position; and coupling the second window and the second display panel to each other.

20 Claims, 24 Drawing Sheets

(51) Int. Cl.
*H10K 50/842* (2023.01)
*H10K 71/00* (2023.01)

(58) Field of Classification Search
CPC ... H01L 27/3244; H01L 27/323; H01L 51/56; H01L 51/5246; H01L 51/524; G02B 1/14; G06F 1/1637; G06F 1/1609
See application file for complete search history.

(56) References Cited

U.S. PATENT DOCUMENTS

| | | | |
|---|---|---|---|
| 9,632,364 B2 | 4/2017 | Han | |
| 9,805,659 B2 | 10/2017 | Ikeda et al. | |
| 10,234,903 B2 | 3/2019 | Park et al. | |
| 10,283,079 B2 | 5/2019 | Jung | |
| 10,510,980 B2 | 12/2019 | Yang et al. | |
| 2001/0052887 A1 | 12/2001 | Tsutsui et al. | |
| 2003/0105610 A1 | 6/2003 | Souda | |
| 2005/0129850 A1* | 6/2005 | Jung | B05C 11/1018 118/713 |
| 2006/0279687 A1* | 12/2006 | Park | G02F 1/1333 349/142 |
| 2010/0271572 A1* | 10/2010 | Yokogawa | G02F 1/1345 349/96 |
| 2013/0153117 A1* | 6/2013 | Kobayashi | B32B 38/1841 156/67 |
| 2016/0085330 A1* | 3/2016 | Namkung | G06F 1/1626 29/729 |
| 2016/0293639 A1* | 10/2016 | Choi | G02F 1/133502 |
| 2017/0090517 A1 | 3/2017 | Park et al. | |
| 2017/0146698 A1* | 5/2017 | Kim | G02B 5/003 |

FOREIGN PATENT DOCUMENTS

| | | |
|---|---|---|
| KR | 10-0658292 | 12/2006 |
| KR | 100673305 B1 | 1/2007 |
| KR | 10-0786039 | 12/2007 |
| KR | 1020140101914 A | 8/2014 |
| KR | 10-2014-0123778 | 10/2014 |
| KR | 1020150055643 A | 5/2015 |
| KR | 10-20150099216 | 8/2015 |
| KR | 10-20160032099 | 3/2016 |
| KR | 10-2016-0057015 | 5/2016 |
| KR | 1020160124310 A | 10/2016 |
| KR | 10-2017-0039024 | 4/2017 |
| KR | 10-20180049369 | 5/2018 |
| KR | 10-2018-0087910 | 8/2018 |

* cited by examiner

DISPLAY DEVICE, MANUFACTURING METHOD THEREOF, AND MANUFACTURING APPARATUS THEREOF

CROSS-REFERENCE TO RELATED APPLICATIONS

This application is a Continuation of U.S. patent application Ser. No. 17/075,648, filed on Oct. 20, 2020, which claims priority from and the benefit of Korean Patent Application No. 10-2019-0135818, filed on Oct. 29, 2019, which is hereby incorporated by reference for all purposes as if fully set forth herein.

BACKGROUND

Field

Exemplary implementations of the invention relate generally to display devices, and, more particularly, to a display device with improved alignment of the display panel and window, a manufacturing method and a manufacturing apparatus thereof.

Discussion of the Background

An electronic device providing an image to a user, such as a smart phone, a digital camera, a notebook computer, a navigation system, and a smart television, includes a display device for displaying the image. In general, the display device includes a display panel for displaying an image and a window disposed on the display panel to protect the front surface of the display panel.

A window may be bonded to a display panel using an optical clear adhesive.

The above information disclosed in this Background section is only for understanding of the background of the inventive concepts, and, therefore, it may contain information that does not constitute prior art.

SUMMARY

Applicant realized that when a window is bonded to a display panel during manufacture of a display device, various factors may hinder the window from being bonded to the display panel in the proper position. Therefore, there is a need for a technology capable of aligning the window and the display panel more precisely.

Display devices, manufacturing apparatus thereof, and methods according to principles and exemplary implementations of the invention improve the accuracy of alignment of a display panel and a window. For example, alignment may be improved by making alignment adjustments based upon positional information obtained from an already manufactured display device.

Additional features of the inventive concepts will be set forth in the description which follows, and in part will be apparent from the description, or may be learned by practice of the inventive concepts.

According to one aspect of the invention, a method for manufacturing a display device includes the steps of: providing a first display panel including a first indicia and a second indicia; disposing a first window including a third indicia on the first display panel; identifying a position of the first indicia and a position of the third indicia; aligning the first display panel and the first window using the positions of the first and third indicia; coupling the first window and the first display panel to each other; identifying a coupled position defined by positions of the second and third indicia of the first display panel and the first window; correcting a position of a second display panel or a position of a second window based on the coupled position; and coupling the second window and the second display panel to each other.

The step of identifying of the position of the first indicia may include: illuminating a first light to the first display panel through a first lighting disposed below the first display panel; and identifying the position of the first indicia through a first camera disposed on the first display panel.

The step of identifying of the position of the third indicia may include: illuminating a second light to the third indicia through a second lighting of a second camera disposed below the first window; and identifying the position of the third indicia through the second camera.

The step of coupling the first window and the first display panel may include bonding the first window and first display panel together such that the coupled position is a bonding position, and the step of identifying the bonding position may include: disposing the second camera below the first display panel; and identifying the bonding position through the second camera.

The first indicia and the third indicia may each include plural indicia, and the step of aligning of the first display panel and the first window may include: overlapping a center point of the first display panel and a center point of the first window; and aligning the first display panel and the first window in a proper position such that gaps between adjacent pairs of the first indicia and the third indicia are substantially constant.

The step of correcting of the position of the second display panel and the position of the second window may include: setting, as a reference position, the position of the first display panel of the first display panel and the first window coupled to each other; calculating a displacement amount of the first window moved based on the reference position; fixing the second display panel; and correcting the position of the second window to a reverse position by the displacement amount of the first window based on the position of the second display panel.

The step of coupling the first display panel and the first window may include bonding them together and the coupled position is a bonding position, and the first display panel and the first window may be provided in a K number, and the bonding position may be defined as the average bonding position of K bonding positions measured when the K first display panels and the K first windows are bonded K times, and K may be a natural number greater than 2.

When viewed in a plan view, the first indicia, the second indicia, and the third indicia may not overlap each other, and the third indicia may be disposed at an outer periphery spaced apart from an edge of the first display panel.

The first, second, and third indicia may include the first mark, second mark, and third marks, respectively, having different shapes.

The first display panel may further include: a display region including a plurality of pixels; and a non-display region around the display region, wherein the first indicia and the second indicia may be disposed in the non-display region.

At least one of the pixels may include: a transistor disposed on a substrate and including a gate electrode, a source electrode, and a drain electrode, and a semiconductor layer; and a light emitting element connected to the transistor, wherein the first indicia may be formed of the same material as the gate electrode and disposed on the same layer as the gate electrode, and the second indicia may be formed of the same material as the semiconductor layer and disposed on the same layer as the semiconductor layer.

The second indicia may be disposed at a level lower in the display device than the first indicia.

The first indicia and the second indicia may include first and second marks formed in an embossed pattern.

The first window may further include: a window film including a transmission region overlapping the display region and a light blocking region overlapping the non-display region; and a print layer disposed below the light blocking region, wherein the third indicia may be disposed in the print layer.

The third indicia may include a third mark formed in an engraved pattern on the print layer.

The first edge portions defined by both sides of the first display panel and second edge portions defined by both sides of the first window may be generally curved, the first indicia and the second indicia may not overlap the first edge portions, and the third indicia may not overlap the second edge portions.

According to another aspect of the invention, a display device may include: a display panel, including: a display region including a plurality of pixels, a non-display region around the display region, and a first indicia and a second indicia disposed in the non-display region; and a window disposed on the display panel and, including: a transmission region overlapping the display region, a light blocking region overlapping the non-display region, and a third indicia disposed in the non-display region; wherein when viewed in a plan view, the first indicia, the second indicia, and the third indicia may not overlap each other, and the third indicia may be disposed at an outer periphery spaced apart from an edge of the display panel.

The first indicia, the second indicia, and the third indicia may have different shapes.

At least one of the pixels may include: a transistor disposed on a substrate and including a gate electrode, a source electrode, and a drain electrode, and a semiconductor layer; and a light emitting element connected to the transistor, wherein the first indicia may not be formed of the same material as the gate electrode and disposed on the same layer as the gate electrode, and the second indicia may be formed of the same material as the semiconductor layer and disposed on the same layer as the semiconductor layer.

The second indicia may be disposed at a level lower in the display device than the first indicia, and the first indicia and the second indicia may include first and second marks, respectively, formed in an embossed pattern.

The window may further include a window film including the transmission region and the light blocking region; and a print layer disposed below the light blocking region, wherein the third indicia may include a third mark formed in an engraved pattern on the print layer.

According to a further aspect of the invention, a manufacturing apparatus of a display device may include: a jig to fix a window disposed on a display panel; a first lighting disposed below the display panel to illuminate a first light to the display panel; and a camera unit disposed between the display panel and the window and including a second lighting to illuminate a second light to the window, wherein the display panel may include a first indicia and a second indicia, the jig may be moveable into a position to be aligned with an outer periphery of the window, and may include a third indicia not overlapping the first and second indicia when viewed in a plan view, and the display panel and the window may be moveable into a position to be aligned bonded to each other according to a position of the first indicia and a position of the third indicia captured by the camera unit.

The camera unit may include: a first camera to capture the first indicia; and a second camera to capture the third indicia.

When the display panel and the window are bonded, the second camera may be positioned below the display panel to capture the second indicia and the third indicia.

According to yet another aspect of the invention, a method for manufacturing a display device may include the steps of: aligning a display panel including a plurality of pixels and a window disposed on the display panel; bonding the window and the display panel to each other; and identifying a position of a first indicia defined on the display panel and a position of a second indicia defined on the window from a position below the display panel, wherein each of the pixels includes a transistor, and a light emitting element connected to the transistor, and the first indicia is formed of the same material as a semiconductor layer of the transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
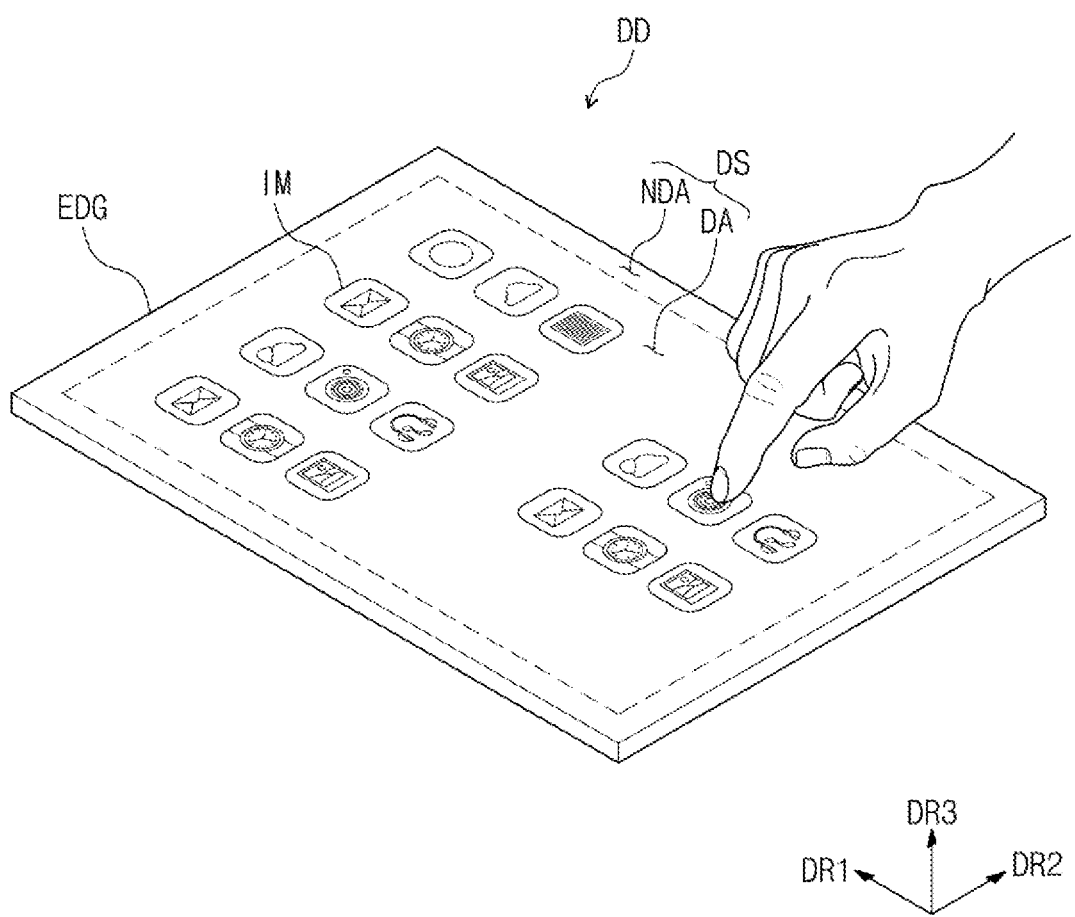
FIG. 1 is a perspective view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device constructed according to principles of the invention.

Referring to FIG. 1, a display device DD may have a generally rectangular shape which has long sides extending in a first direction DR1 and short sides extending in a second direction DR2 which crosses the first direction DR1. However, the exemplary embodiments are not limited thereto. The display device DD may have various shapes such as a generally circular shape or a generally polygonal shape.

Hereinafter, a direction substantially perpendicularly intersecting a plane defined by the first direction DR1 and the second direction DR2 is defined as a third direction DR3. In addition, as used herein, "when viewed in plan view" may mean when viewed from the third direction DR3.

The top surface of the display device DD may be defined as a display surface DS and may have a plane defined by the first direction DR1 and the second direction DR2. Images IM generated in the display device DD may be provided to a user through the display surface DS.

The display surface DS may include a display region DA and a non-display region NDA around the display region DA. The display region DA displays the image IM, and the non-display region NDA may not display the image IM. The non-display region NDA surrounds the display region DA and may define the edge EDG of the display device DD printed in a predetermined color.

The display device DD may be used for a large electronic device such as a television, a monitor, or an external advertisement board. Also, the display device DD may be used for a small-and-medium-sized electronic device such as a personal computer, a notebook computer, a personal digital terminal, a car navigation system, a game machine, a smart phone, a tablet, or a camera. However, these are merely exemplary embodiments, and the display device DD may be used for other electronic devices.

Figure 2:
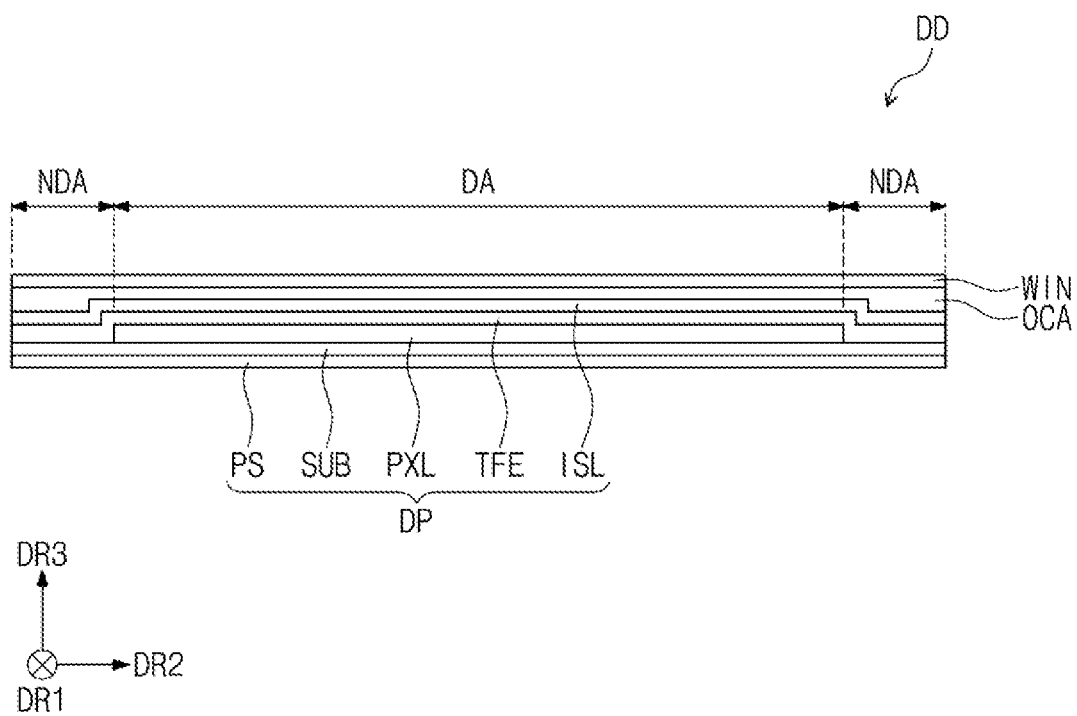
FIG. 2 is a cross-sectional view schematically illustrating the display device shown in FIG. 1.

FIG. 2 is a cross-sectional view schematically illustrating the display device shown in FIG. 1.

Referring to FIG. 2, the display device DD may include a display panel DP, a window WIN disposed on the display panel DP, and an adhesive OCA disposed between the display panel DP and the window WIN.

The display panel DP may be a light emitting type display panel, but is not particularly limited thereto. For example, the display panel DP may be an organic light emitting display panel or a quantum dot light emitting display panel. A light emitting layer of an organic light emitting display panel may include an organic light emitting material. A light emitting layer of a quantum dot light emitting display panel may include quantum dots, quantum loads, and the like. Hereinafter, the display panel DP will be described for convenience as an organic light emitting display panel.

The display panel DP may include a substrate SUB, a pixel layer PXL disposed on the substrate SUB, a thin film encapsulation layer TFE disposed on the substrate SUB to cover the pixel layer PXL, an input sensing layer ISL disposed on the thin film encapsulation layer TFE, and a protection substrate disposed below the substrate SUB.

The substrate SUB is a transparent substrate and may include a flexible plastic substrate. For example, the substrate SUB may include a polyimide (PI). The substrate SUB may include a display region DA and a non-display region NDA around the display region DA. The pixel layer PXL may be disposed on the display region DA. The pixel layer includes a plurality of pixels, and each of the pixels may include a light emitting element.

The thin film encapsulation layer may include at least two inorganic layers and an organic layer disposed between the inorganic layers. The inorganic layers include an inorganic material and may protect the pixel layer PXL from moisture/oxygen. The organic layer includes an organic material and may protect the pixel layer PXL from foreign materials such as dust particles.

The input sensing layer ISL may sense an external input (for example, a user's touch). The input sensing layer ISL may include a plurality of sensors for sensing an external input. The sensors may sense an external input in a capacitive manner. The display panel DP may generate an image corresponding to an external input sensed in the input sensing layer ISL. The input sensing layer ISL may be provided directly on the thin film encapsulation layer TFE.

The protection substrate PS may protect a lower portion of the substrate SUB. The substrate SUB may include a flexible plastic substrate. For example, the protection substrate PS may include a polyethylene terephthalate (PET).

The window WIN may protect the display panel DP from external scratch and impact. The window WIN may be attached to the display panel DP using the adhesive OCA. The adhesive OCA may include an optical clear adhesive. The image IM generated in the display panel DP may be provided to a user by being transmitted through the window WIN.

For convenience of description, both sides of the display panel DP and both sides of the window WIN may each have a generally curved shape. The above configuration will be described in detail with reference to FIG. 13 below.

Figure 3:
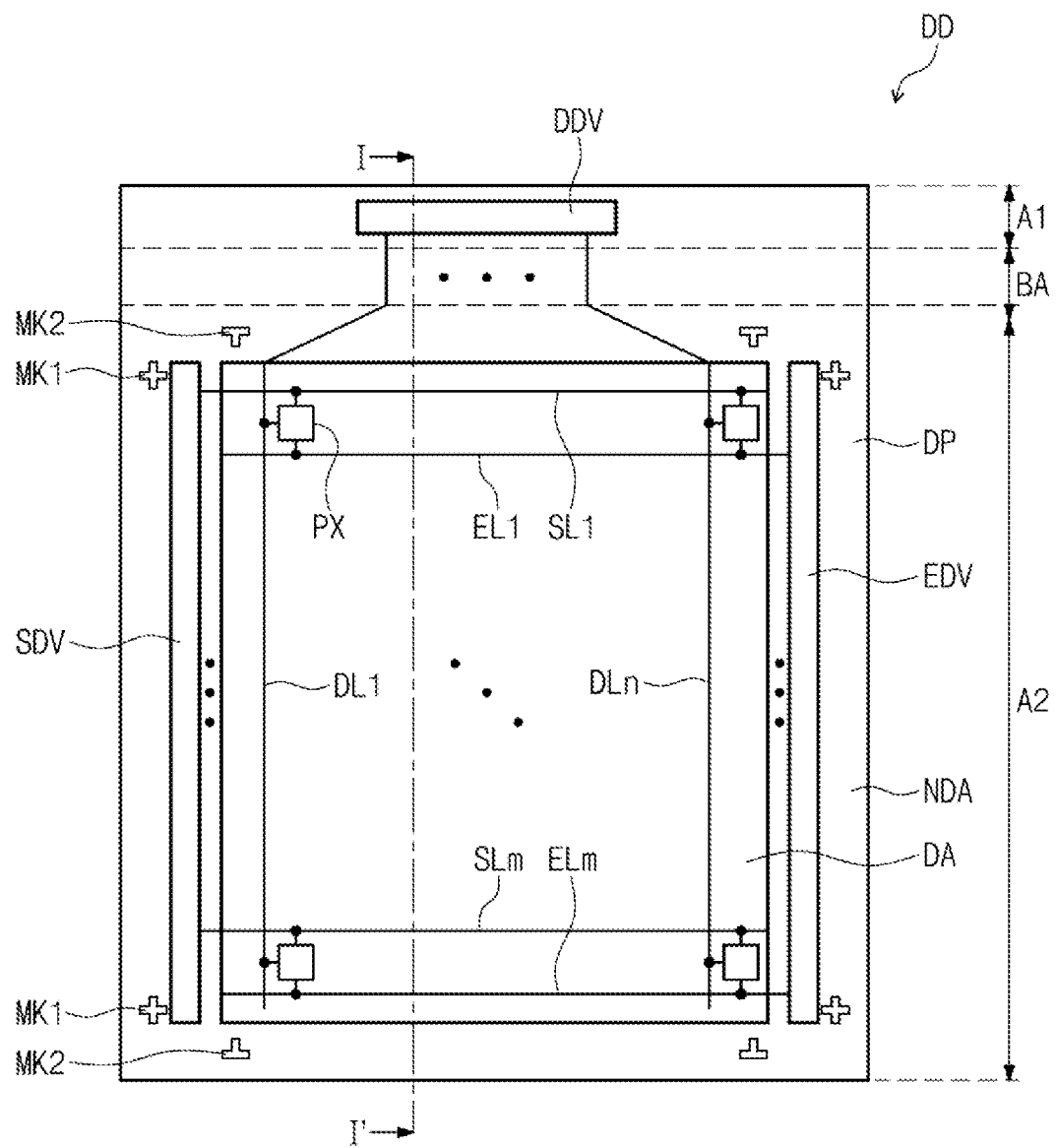
FIG. 3 is a plan view of an exemplary embodiment of the display panel shown in FIG. 2.

FIG. 3 is a plan view of an exemplary embodiment of the display panel shown in FIG. 2.

Referring to FIG. 3, the display device DD may include the display panel DP, a scan driver SDV, a data driver DDV, and an emission driver EDV.

The display panel DP may be a flexible display panel. For example, the display panel DP may include a plurality of electronic elements disposed on a flexible substrate. The display panel DP may have a generally rectangular shape which has long sides extending in the first direction DR1 and short sides extending in the second direction DR2.

The display panel DP may include a first region A1, a second region A2, and a bending region BA between the first region A1 and the second region A2. The bending region BA extends in the second direction DR2, and the first region A1, the bending region BA, and the second region A2 may be arranged in the first direction DR1.

The second region A2 may include the display region DA and the non-display region NDA around the display region DA. The non-display region NDA may surround the display region DA. The display region DA displays the image IM, and the non-display region NDA may not display the image IM. The first region A1 and the bending region BA may not display the image IM. A region that does not display the image IM may be defined as a bezel region.

The display panel DP may include a plurality of pixels PX, a plurality of scan lines SL1 to SLm, a plurality of data lines DL1 to DLn, and a plurality of emission lines EL1 to Elm. The variables m and n are each a natural number. The pixels PX may be arranged in a matrix form, but are not limited thereto, and may be arranged in various forms. The pixels PX are disposed in the display region DA and may be connected to the scan lines SL1 to SLm, the data lines DL1 to DLn, and the emission lines EL1 to Elm.

The scan driver SDV and the emission driver EDV are disposed in the non-display region NDA, and the data driver DDV may be disposed in the first region A1. The scan driver SDV and the emission driver EDV may be disposed in the non-display region NDA which is adjacent to each of the long sides of the display panel DP. The data driver DDV may be manufactured in the form of an integrated circuit chip and disposed in the first region A1.

The scan lines SL1 to SLm may be extended in the second direction DR2 and connected to the scan driver SDV. The data lines DL1 to DLn are extended in the first direction DR1 and may be connected to the data driver DDV via the bending region BA. The emission lines EL1 to ELm may be extended in the second direction DR2 and connected to the emission driver EDV.

The scan driver SDV generates a plurality of scan signals, and the scan signals may be applied to the pixels PX through the scan lines SL1 to SLm. The scan signals may be sequentially applied to the pixels PX. The data driver DDV generates a plurality of data voltages, and the data voltages may be applied to the pixels PX through the data lines DL1 to DLn. The emission driver EDV generates a plurality of emission signals, and the emission signals may be applied to the pixels PX through the emission lines EL1 to ELm.

The display device DD may include a timing controller for controlling the operations of the scan driver SDV, the data driver DDV, and the emission driver EDV.

The timing controller may generate a scan control signal, a data control signal, and an emission control signal in response to control signals received from the outside. The timing controller receives image signals from the outside and may convert the data format of the image signals to match interface specifications with the data driver DDV and provide the image signals with converted data format to the data driver DDV.

The scan driver SDV generates scan signals in response to the scan control signal, and the emission driver EDV may generate emission signals in response to the emission control signal. The data driver DDV is provided with the image signals with converted data format and may generate data voltages corresponding to the image signals in response to the data control signal.

The pixels PX may be provided with the data voltages in response to the scan signals. The pixels PX emit light of luminance corresponding to the data voltages in response to the emission signals, and thus, may display an image. The emission duration of the pixels PX may be controlled by the emission signals.

The display panel DP may include a plurality of indicia that may be in the form of first marks MK1 and a plurality of second marks MK2. The first marks MK1 and the second marks MK2 may be disposed in the non-display region NDA. The first marks MK1 may be arranged in the second direction DR2 having the display region DA therebetween. The second marks MK2 may be arranged in the first direction DR1 having the display region DA therebetween. However, the positions of the first and second marks MK1 and MK2 are not limited thereto.

The first marks MK1 may have different shapes from the second marks MK2. For example, the first marks MK1 may have the general shape of "+," and the second marks MK2 may have the general shape of "T." However, the shapes of the first and second marks MK1 and MK2 are not limited thereto.

When viewed in a plan view, the first marks MK1 may not overlap the second marks MK2. However, the exemplary embodiments are not limited thereto. The first marks MK1 and the second marks MK2 may partially overlap each other. In addition, the first and second marks MK1 and MK2 may be disposed so as not to overlap the data lines DL1 to DLn. The first and second marks MK1 and MK2 are, for example, disposed to be adjacent to an edge portion of the display region DA. However, the positions at which the first and second marks MK1 and MK2 are disposed are not limited thereto.

Illustratively, four first marks MK1 and four second marks MK2 are disposed in the non-display region NDA. However, the number of the first and second marks MK1 and MK2 is not limited thereto. Functions of the first and second marks MK1 and MK2 will be described in detail with reference to a method for manufacturing the display device DD according to some exemplary embodiments.

Figure 4:
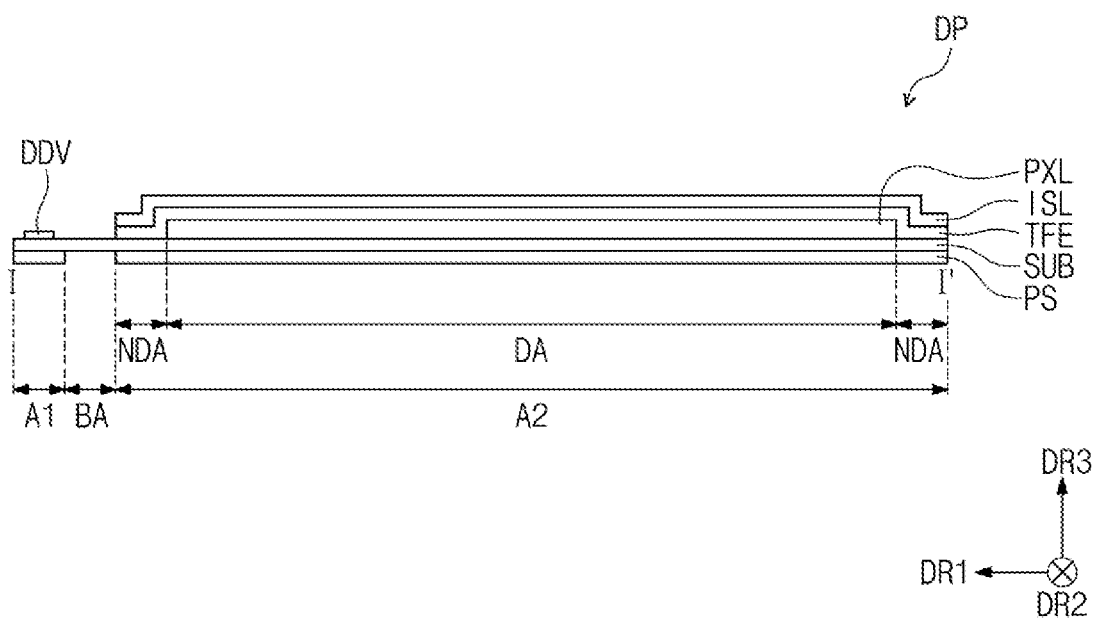
FIG. 4 is a cross-sectional view taken along line I-I' shown in FIG. 3.
Figure 5:
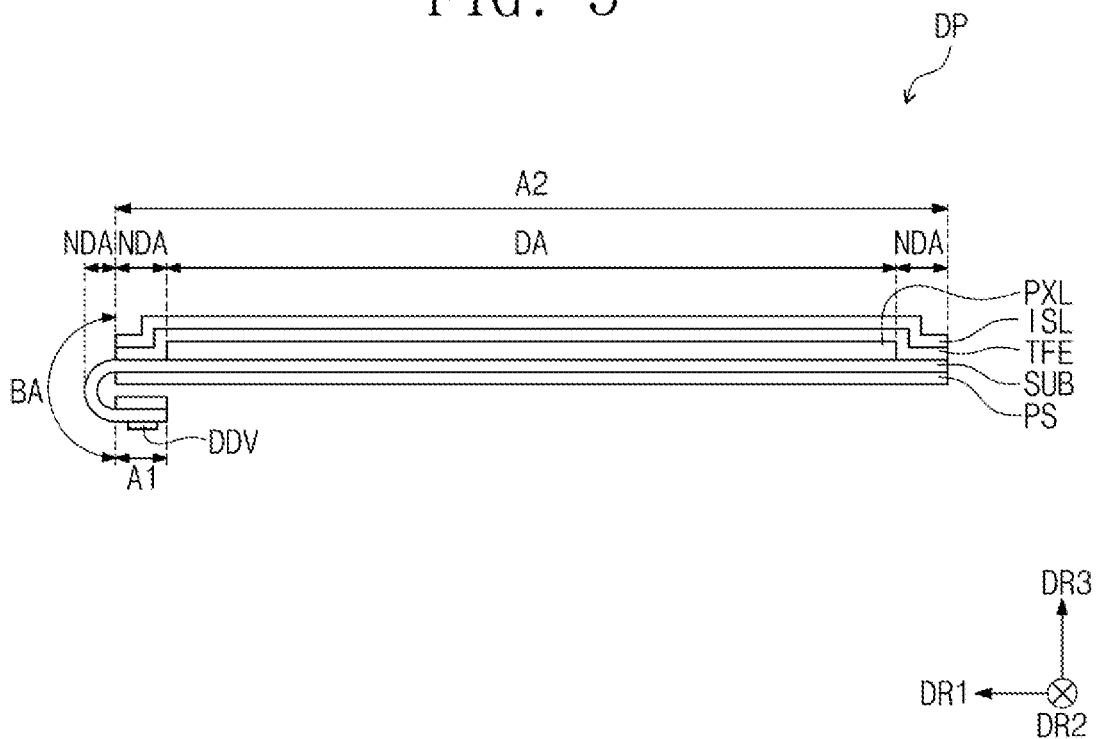
FIG. 5 is a view illustrating an exemplary embodiment of the bending region shown in FIG. 4 in a bent state.

FIG. 4 is a cross-sectional view taken along line I-I' shown in FIG. 3. FIG. 5 is a view illustrating an exemplary embodiment of the bending region shown in FIG. 4 in a bent state.

Referring to FIG. 4, as described above, the protection substrate PS is disposed below the substrate SUB, and the thin film encapsulation layer TFE and the input sensing layer ISL may be disposed on the substrate SUB. The data driver DDV may be disposed on the substrate SUB in the first region A1.

The protection substrate PS is disposed below the substrate SUB in the first region A1 and the second region A2 and may not be disposed below the substrate SUB in the bending region BA. Substantially, after the protection substrate PS is disposed below the substrate SUB, a portion of the protection substrate PS overlapping the bending region BA may be removed.

Referring to FIG. 5, the bending region BA may be bent toward a lower portion of the display panel DP. The bending region BA may be bent such that the first region A1 is disposed below the second region A2. Accordingly, the data driver DDV may be disposed below the display panel DP. Since the second region A2 is disposed below the back surface of the first region A1, when viewed in a plan view, the bezel region of the display panel DP may be minimized.

Since the protection substrate PS is not disposed in the bending region BA, the thickness of the bending region BA of the display device DD is reduced, to facilitate bending the bending region BA more easily. When viewed in a plan view, the bending region BA exposed to the outside may be defined as the non-display region NDA.

Figure 6:
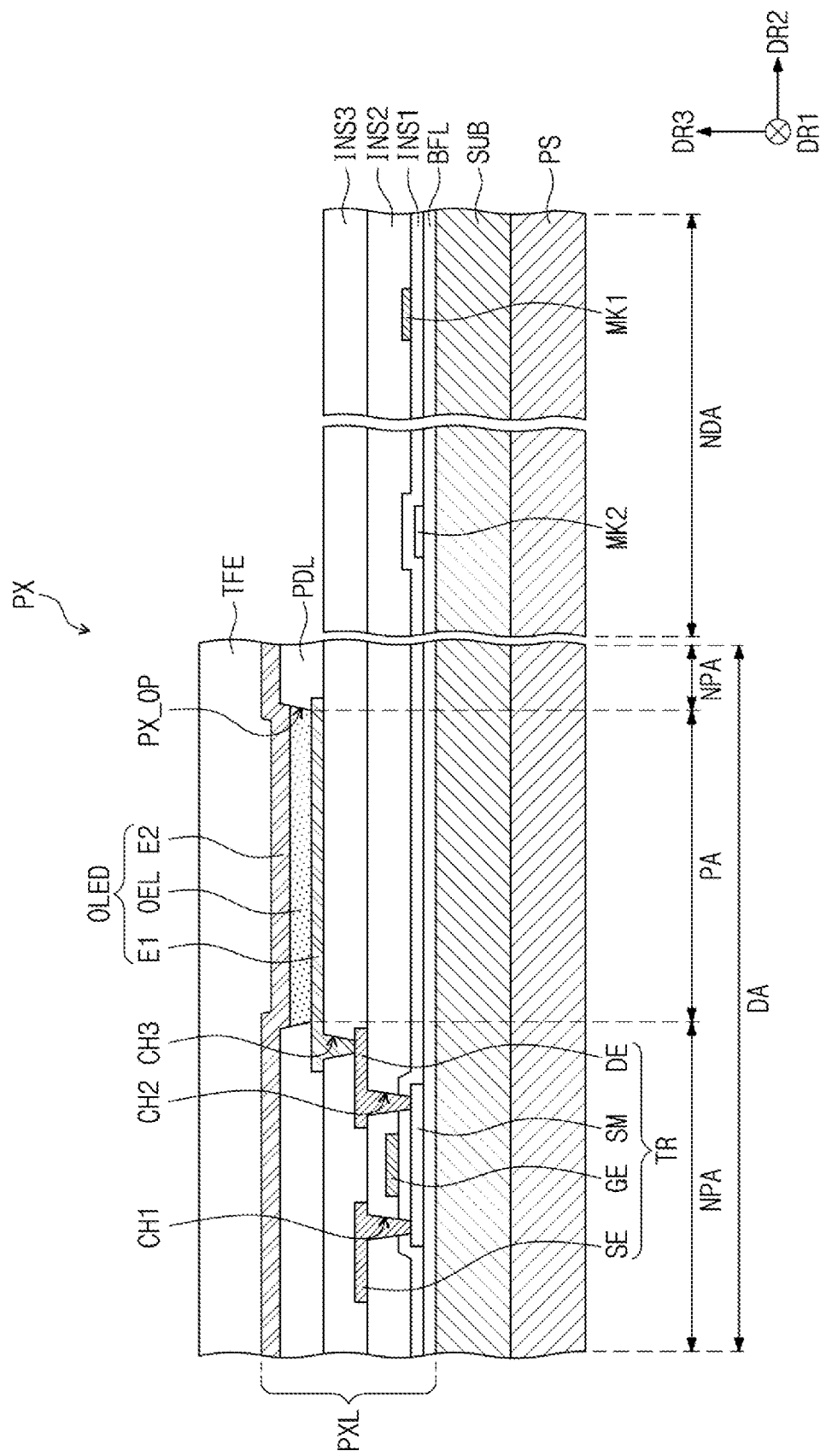
FIG. 6 is a cross-sectional view schematically illustrating a representative pixel, representative first mark, and representative second mark shown in FIG. 2.
Figure 7:
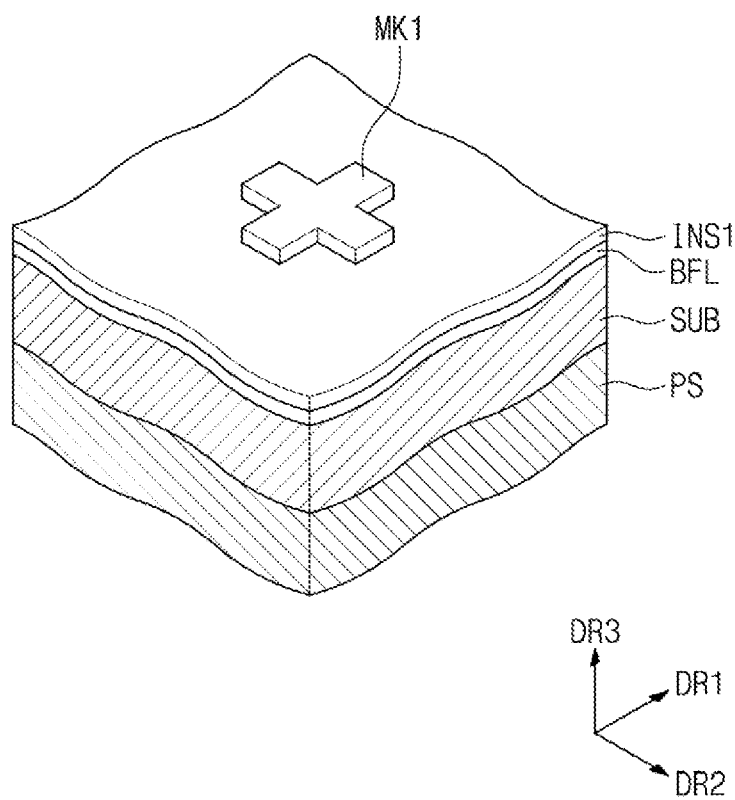
FIG. 7 is a perspective view of an exemplary embodiment of the first mark shown in FIG. 6.
Figure 8:
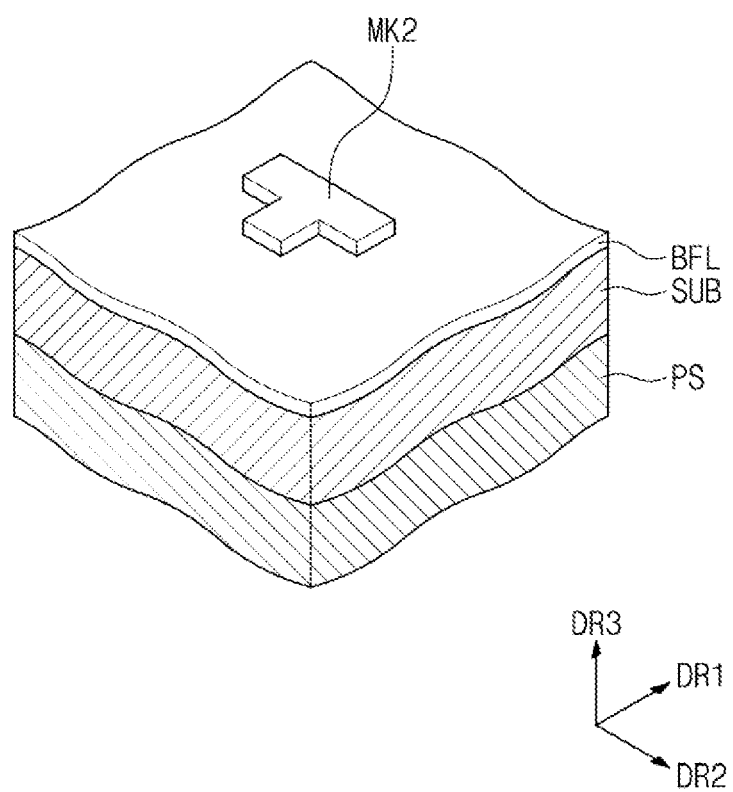
FIG. 8 is a perspective view of an exemplary embodiment of the second mark shown in FIG. 6.

FIG. 6 is a cross-sectional view schematically illustrating a representative pixel, representative first mark, and representative second mark shown in FIG. 2. FIG. 7 is a perspective view of an exemplary embodiment of the first mark shown in FIG. 6. FIG. 8 is a perspective view of an exemplary embodiment of the second mark shown in FIG. 6.

Referring to FIG. 6, the representative pixel PX may include a light emitting element OLED, and a transistor TR connected to the light emitting element OLED. The light emitting element OLED may include a first electrode E1, a second electrode E2, and an organic light emitting layer OEL disposed between the first electrode E1 and the second electrode E2.

The first electrode E1 may be an anode electrode, and the second electrode E2 may be a cathode electrode. The first electrode E1 may be defined as a pixel electrode, and the second electrode E2 may be defined as a common electrode.

The representative pixel PX may be divided into a pixel region PA and a non-pixel region NPA around the pixel region PA. The light emitting element OLED is disposed in the pixel region PA, and the transistor TR may be disposed in the non-pixel region NPA.

The transistor TR and the light emitting element OLED may be disposed on the substrate SUB. On the substrate SUB, a buffer layer BFL is disposed, and the buffer layer BFL may include an inorganic material.

On the buffer film BFL, a semiconductor layer SM of the transistor TR may be disposed. The semiconductor layer SM may include a semiconductor of an inorganic material such as amorphous silicon or crystalline silicon, or an organic semiconductor. In addition, the semiconductor layer SM may include an oxide semiconductor. The semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. On the first insulation layer INS1, a gate electrode GE of the transistor TR overlapping the semiconductor layer SM may be disposed. The gate electrode GE may be disposed to overlap the channel region of the semiconductor layer SM.

A second insulation layer INS2 may be disposed on the first insulation layer INS1 to cover the gate electrode GE. The second insulation layer INS2 may include an organic material and/or an inorganic material. On the second insulation layer INS2, a source electrode SE and a drain electrode DE of the transistor TR may be disposed spaced apart from each other. The gate electrode GE, the source electrode SE, and the drain electrode DE may include a metal.

The source electrode SE may be connected to the source region of the semiconductor layer SM through a first contact hole CH1 defined on the first insulation layer INS1 and the second insulation layer INS2. The drain electrode DE may be connected to the drain region of the semiconductor layer SM through a second contact hole CH2 defined on the first insulation layer INS1 and the second insulation layer INS2.

A third insulation layer INS3 may be disposed on the second insulation layer INS2 to cover the source electrode SE and the drain electrode DE of the transistor TR. The third insulation layer INS3 may be defined as a planarization film which provides the flat top surface and may include an organic material.

On the third insulation layer INS3, the first electrode E1 may be disposed. The first electrode E1 may be connected to the drain electrode DE of the transistor TR through a third contact hole CH3 defined on the third insulation layer INS3.

On the first electrode E1 and the third insulation layer INS3, a pixel definition film PDL which exposes a predetermined portion of the first electrode E1 may be disposed. On the pixel definition film PDL, an opening PX_OP for exposing a predetermined portion of the first electrode E1 may be defined.

In the opening PX_OP, the organic light emitting layer OEL may be disposed on the first electrode E1. The organic light emitting layer OEL may generate light of any one of red, green, and blue colors. However, the exemplary embodiments are not limited thereto. The organic light emitting layer OEL may generate white light due to the combination of organic materials generating red, green, and blue colors.

Between the pixel definition film PDL and the organic light emitting layer OEL, the second electrode E2 may be disposed. The thin film encapsulation layer TFE may be disposed on the light emitting element OLED to cover the pixel PX. A layer between the substrate SUB and the thin film encapsulation layer TFE may be defined as the pixel layer PXL.

A first voltage ELVDD is applied to the first electrode E1, and a second voltage ELVSS may be applied to the second electrode E2. A hole and an electron injected from the light emitting element OLED are combined to form an exciton, and when the exciton transits to a ground state, the light emitting element OLED may emit light. As the light emitting element OLED emits light of red, green, and blue colors according to the flow of a current, the image IM may be displayed.

The representative first mark MK1 may be disposed on the first insulation layer INS1. The first mark MK1 may be formed by being simultaneously patterned with the gate electrode GE using the same material. The first mark MK1 may be disposed on the same layer as the gate electrode GE. However, the exemplary embodiments are not limited thereto. The first mark MK1 may be formed on different layers of the pixel PX using the same material as the gate electrode GE.

The representative second mark MK2 may be disposed on the buffer layer BFL. The second mark MK2 may be formed by being simultaneously patterned with the semiconductor layer SM using the same material. The second mark MK2 may be disposed on the same layer as the semiconductor layer SM. The second mark MK2 may be disposed at a level lower in the display device than the first mark MK1.

However, the exemplary embodiments are not limited thereto. The second mark MK2 may be formed on different layers of the pixel PX using the same material as the semiconductor layer SM. In addition, the second mark MK2 may be formed on different layers of the pixel PX using the same material as the gate electrode GE or the source and drain electrodes SE or DE in addition to the semiconductor layer SM.

Referring to FIG. 7 and FIG. 8, the first mark MK1 and the second mark MK2 may each be formed in an embossed pattern. However, the exemplary embodiments are not limited thereto. The first marks MK1 and the second marks MK2 may each be formed in an engraved pattern, or could be flush with the surface of the layer.

Figure 9:
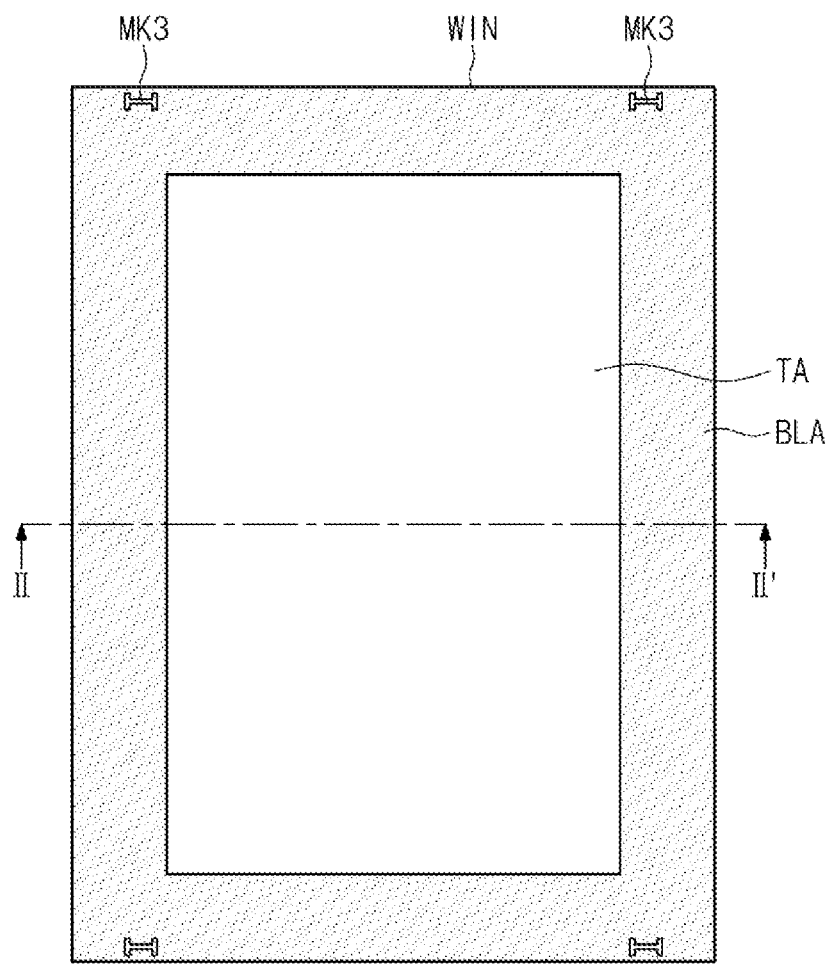
FIG. 9 is a plan view of an exemplary embodiment of the window shown in FIG. 2.
Figure 10:
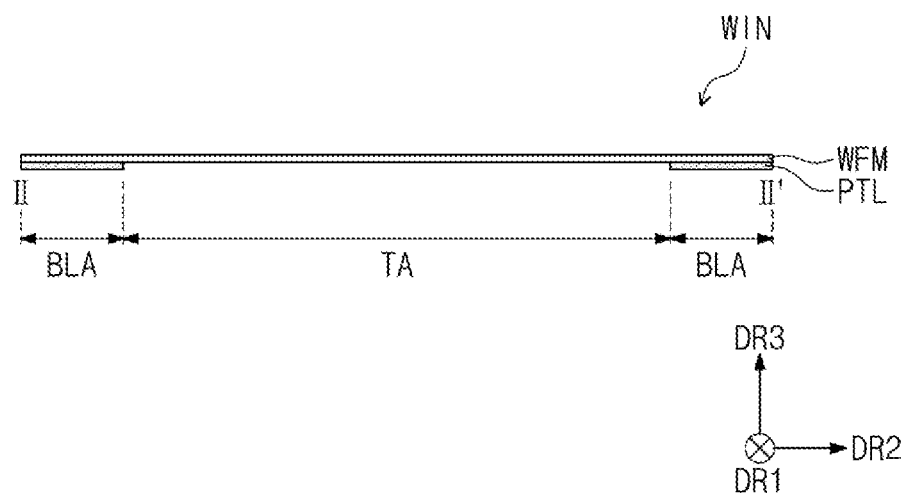
FIG. 10 is a cross-sectional view taken along line II-II' shown in FIG. 9.
Figure 11:
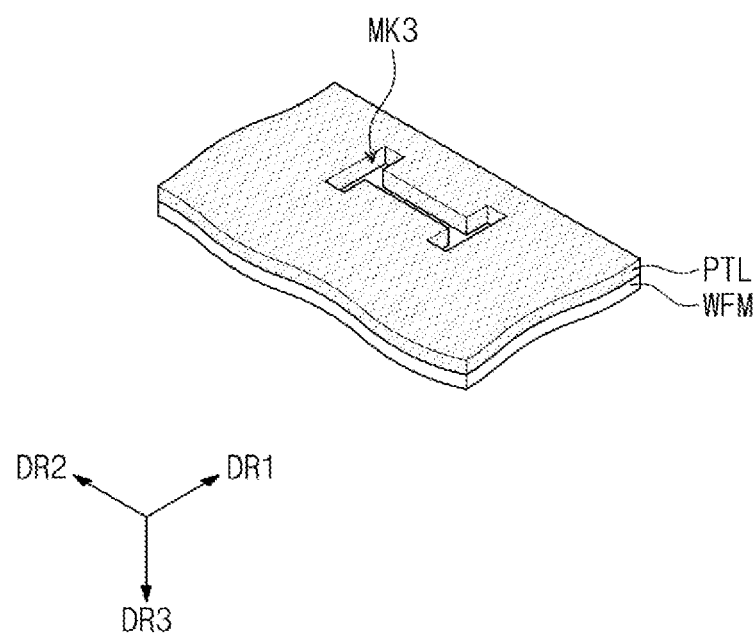
FIG. 11 is a perspective view of an exemplary embodiment of a representative third mark shown in FIG. 9.

FIG. 9 is a plan view of an exemplary embodiment of the window shown in FIG. 2. FIG. 10 is a cross-sectional view taken along line II-II' shown in FIG. 9. FIG. 11 is a perspective view of an exemplary embodiment of a representative third mark shown in FIG. 9.

Referring to FIG. 9, the window WIN may have a generally rectangular shape which has long sides in the first direction DR1 and short sides in the second direction DR2. The window WIN may include a transmission region TA, a light blocking region BLA around the transmission region TA, and a plurality of third marks MK3 disposed in the light blocking region BLA. The transmission region TA may transmit light, and the light blocking region BLA may block light.

The third marks MK3 may have the general shape of "I," but the shape of the third marks MK3 is not limited thereto. For example, four third marks MK3 are disposed in the light blocking region BLA, but the number of the third marks MK3 is not limited thereto. In addition, the third marks MK3 are disposed to be adjacent to an edge portion of the window WIN. However, the positions at which the third marks MK3 are disposed are not limited thereto.

Referring to FIG. 10, the window WIN may include a window film WFM having the transmission region TA and the light blocking region BLA and a print layer PTL disposed below the window film WFM. The print layer PTL may overlap the light blocking region BLA and be disposed below the light blocking region BLA. The print layer PTL may have a predetermined color, and for example, the print layer PTL may have a color of black. The third marks MK3 may be disposed on the print layer PTL.

Referring to FIG. 11, the print layer PTL may include the representative third mark MK3, and specifically, the third mark MK3 may be formed in an engraved pattern on the print layer PTL. A predetermined portion of the print layer PTL may be removed to form the third mark MK3. However, the exemplary embodiments are not limited thereto. The third mark MK3 may be formed in an embossed pattern on the print layer PTL. In addition, the third mark MK3 may not be formed on the print layer PTL but formed as an engraved groove on the window film WFM.

Figure 12:
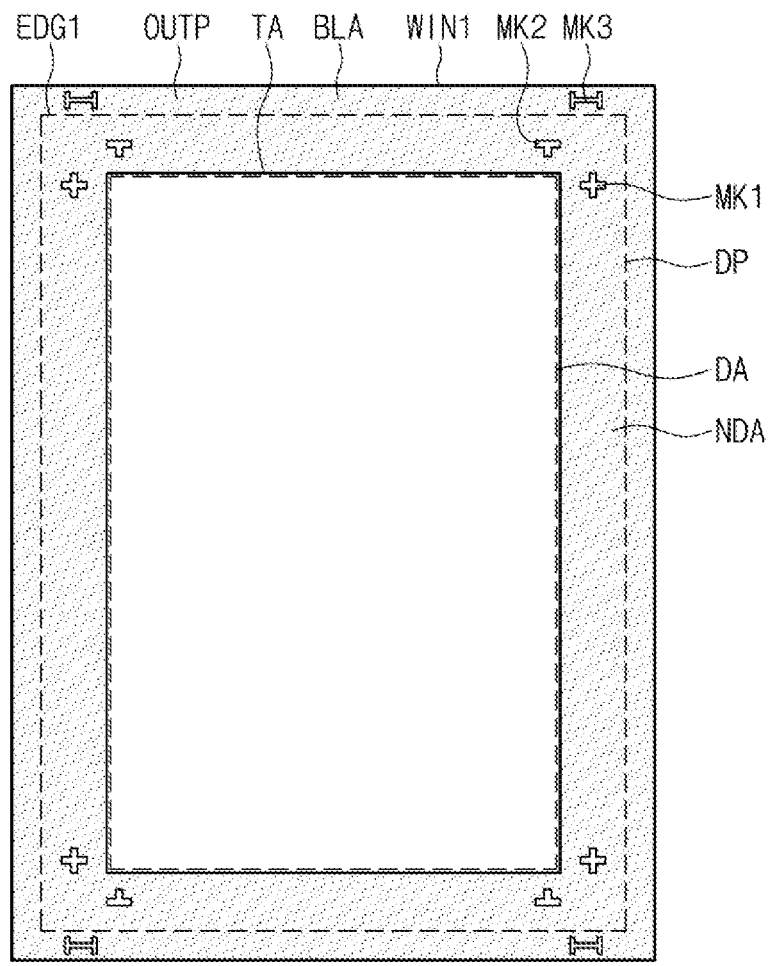
FIG. 12 is a plan view showing the display panel and the window shown in FIG. 3 and FIG. 9 overlapping each other.
Figure 12:
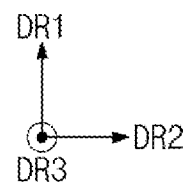
Figure 13:
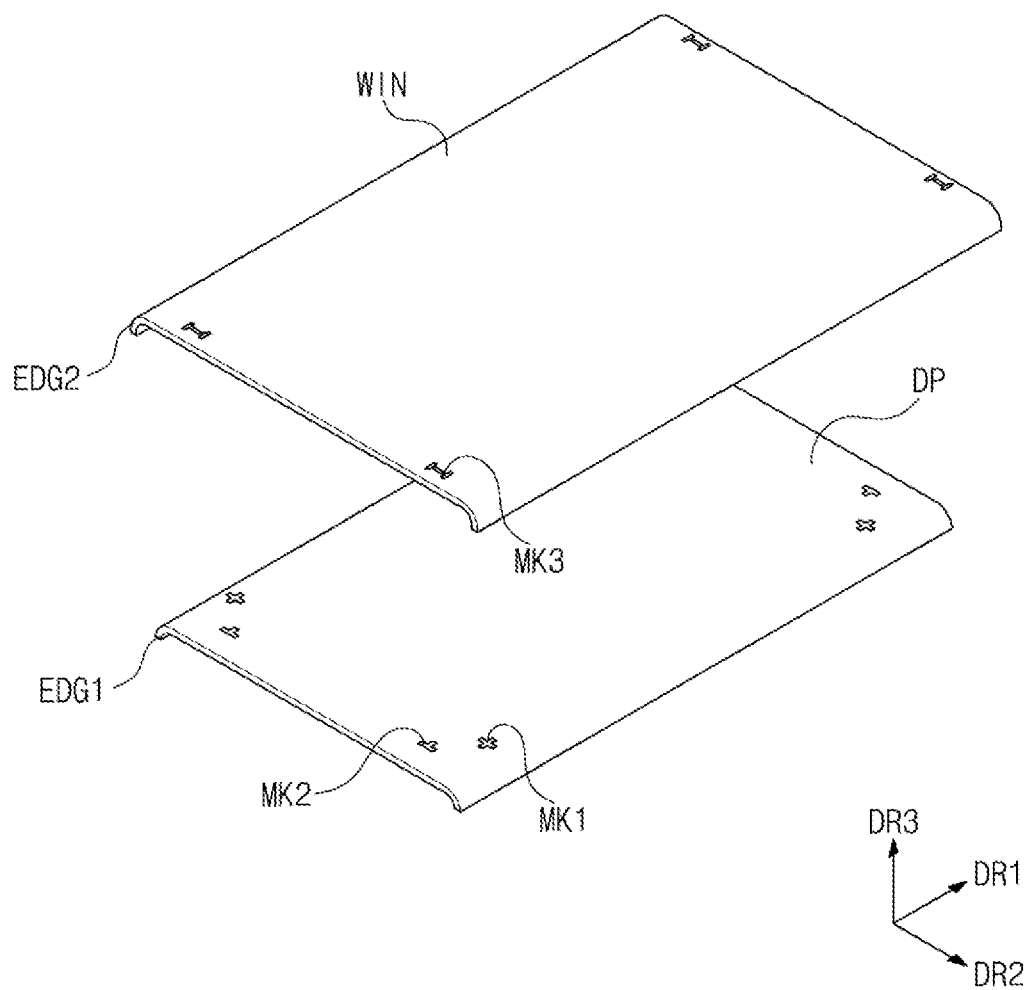
FIG. 13 is an exploded view illustrating an exemplary embodiment of edge portions of the display panel and the window shown in FIG. 12.

FIG. 12 is a plan view showing the display panel and the window shown in FIG. 3 and FIG. 9 overlapping each other. FIG. 13 is an exploded view illustrating an exemplary embodiment of edge portions of the display panel and the window shown in FIG. 12.

For convenience of description, the display region DA, the non-display region NDA, and the first and second marks MK1 and MK2 of the display panel DP are illustrated, and other components of the display panel DP are omitted to better illustrate certain concepts.

The first region A1 of the display panel DP is disposed under the second region A2 when the bending region BA is bent, and thus, is omitted from FIG. 12. In addition, the bent bending region BA is substantially the non-display region NDA when viewed in a plan view, and thus, is not separately illustrated in FIG. 12. In the drawings below, for convenience of description, the planar configuration of the display panel DP will be described as the planar structure of the display panel DP illustrated in FIG. 12.

Referring to FIG. 12, when the window WIN is disposed on the display panel DP, the planar area of the window WIN may be larger than the planar area of the display panel DP. Accordingly, the edge EDG2 of the window WIN may be disposed beyond the outer periphery and the edge EDG1 of the display panel DP.

The transmission region TA of the window WIN may overlap the display region DA of the display panel DP. The light blocking region BLA of the window WIN may overlap the non-display region NDA of the display panel DP.

When viewed in a plan view, the first marks MK1, the second marks MK2, and the third marks MK3 may not overlap each other. However, the exemplary embodiments are not limited thereto. The first marks MK1, the second marks MK2, and the third marks MK3 may partially overlap each other. The first marks MK1, the second marks MK2, and the third marks MK3 may have different shapes from each other. When viewed in a plan view, the third marks MK3 do not overlap the display panel DP and may be disposed at the outer periphery OUTP of the window WIN1 and spaced apart from an edge EDG1 of the display panel DP.

Referring to FIG. 12 and FIG. 13, both sides of the display panel DP opposite to each other in the second direction DR2 may be defined as first edges EDG1. Both sides of the window WIN opposite to each other in the second direction DR2 may be defined as second edges EDG2.

The first edges EDG1 and the second edges EDG2 may have a generally curved shape. The first and second marks MK1 and MK2 may be disposed on a substantially flat portion of the display panel DP. The third marks MK3 may be disposed on a substantially flat portion of the window WIN. However, the exemplary embodiments are not limited thereto. The first and second marks MK1 and MK2 may overlap the first edges EDG1, and the third marks MK3 may overlap the second edges EDG2.

Figure 14:
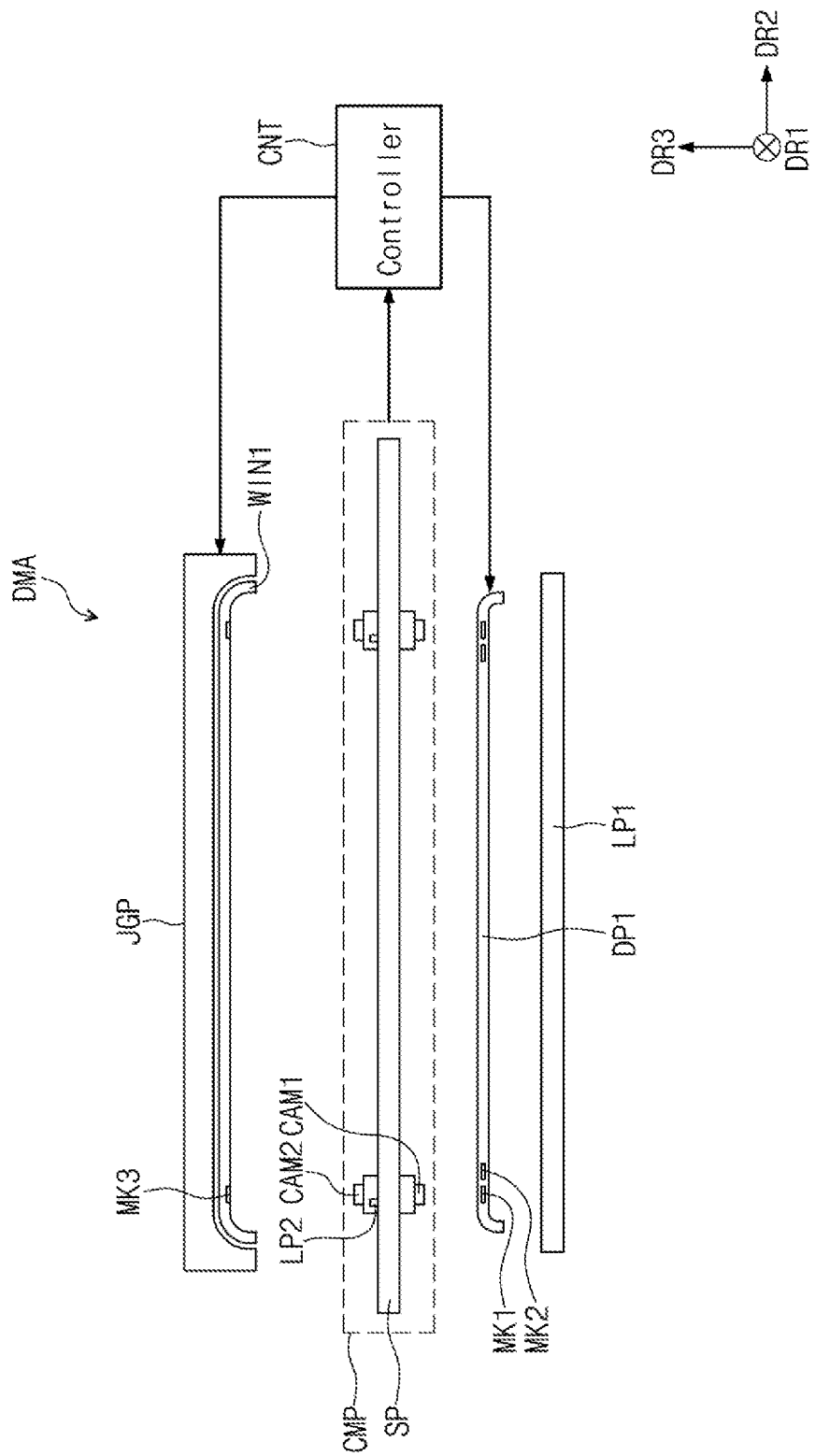
FIG. 14 is a schematic diagram illustrating an exemplary embodiment of a manufacturing apparatus of the display device constructed according to principles of the invention.
Figure 15:
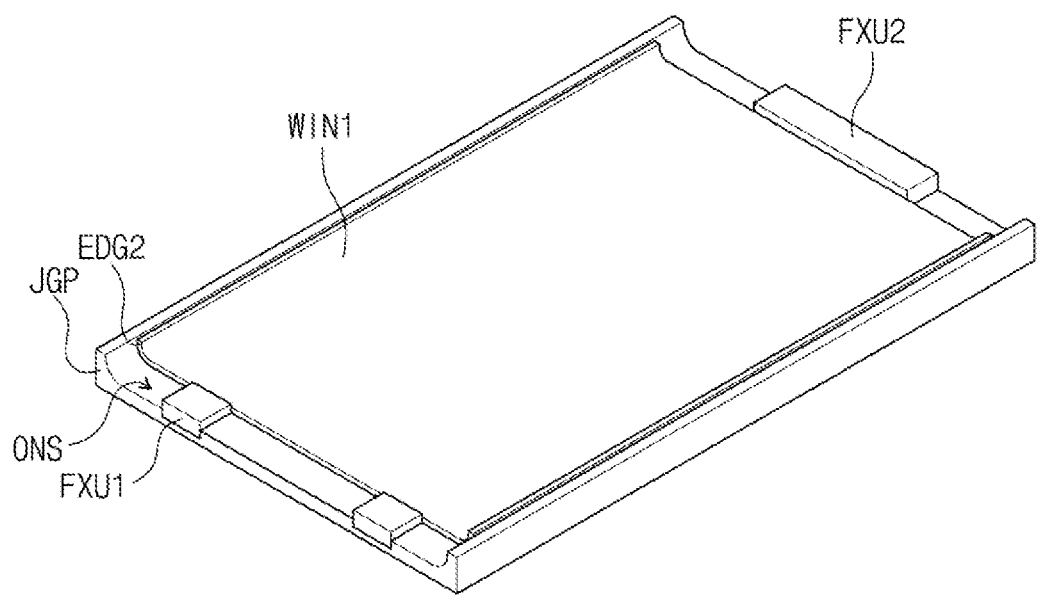
FIG. 15 is a perspective view of an exemplary embodiment of the jig portion shown in FIG. 14.
Figure 15:
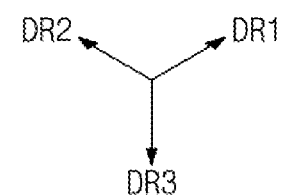

FIG. 14 is a schematic diagram illustrating an exemplary embodiment of a manufacturing apparatus of the display device constructed according to principles of the invention. FIG. 15 is a perspective view of an exemplary embodiment of the jig portion shown in FIG. 14.

In FIG. 14, for convenience of description, the side surface of a first display panel DP1 and the side surface of a first window WIN1 viewed in the first direction DR1 are shown. In addition, the first, second, and third marks MK1, MK2, and MK3 are shown together with the first display panel DP1 and the first window WIN1.

Referring to FIG. 14, a manufacturing apparatus DMA for the display device may include a camera unit CMP, a jig may be in the form of a jig portion JGP, a first lighting LP1, and a control unit CNT. On the first display panel DP1, the first window WIN1 is disposed, and the camera unit CMP may be disposed between the first display panel DP1 and the first window WIN1. The first display panel DP1 and the first window WIN1 may have the same configurations as the display panel DP and the window WIN shown in FIG. 3 and FIG. 9.

The camera unit CMP may capture the first marks MK1 and the third marks MK3 between the first display panel DP1 and the first window WIN1. When the first display panel DP1 and the first window WIN1 are coupled together, such as by being bonded to each other, the camera unit CMP may be disposed below the first display panel DP1 and capture the second marks MK2 and the third marks MK3.

The position information of the first marks MK1, the position information of the second marks MK2, and the position information of the third marks MK3 captured in the camera unit CMP may be provided to the control unit CNT. Substantially, the coordinates of the first marks MK1, the coordinates of the second marks MK2, and the coordinates of the third marks MK3 captured in the camera unit CMP may be provided as the position information to the control unit CNT.

Based on the position information of the first and third marks MK1 and MK3, the control unit CNT may align the first display panel DP1 and the first window WIN1. Based on the position information of the second and third marks MK2 and MK3, the control unit CNT may compensate for errors in the position of a second display panel and a second window to be processed in a bonding process to be followed. The above operation will be described in detail hereinafter.

The camera unit CMP may include a support portion SP, a plurality of first cameras CAM1 disposed below the support portion SP, and a plurality of second cameras CAM2 disposed above the support portion SP. The first cameras CAM1 may capture components disposed above the first cameras CAM1. The second cameras CAM2 may capture components disposed below the second cameras CAM2.

The first lighting LP1 may be disposed below the first display panel DP1 and irradiate first light upward. Each of the second cameras CAM2 may include a second lighting LP2. The second lighting LP2 may irradiate second light upward.

The first and second cameras CAM1 and CAM2 may capture the first, second, and third marks MK1, MK2, and MK3 disposed on a flat portion of the display panel DP and on a flat portion of the window WIN. However, the exemplary embodiments are not limited thereto. When the first and second marks MK1 and MK2 overlap the first edges EDG1 and the third marks MK3 overlaps the second edges EDG2, the first and second cameras CAM1 and CAM2 may capture the first, second, and third marks MK1, MK2, and MK3 disposed in the first and second edges EDG1 and EDG2.

Referring to FIG. 14 and FIG. 15, on one surface ONS of the jig portion JGP facing the first display panel DP1, the first window WIN1 may be disposed. The jig portion JGP may include a generally curved surface on which the second edges EDG2 of the first window WIN1 sit.

On both sides of the jig portion JGP opposite to each other in the first direction DR1, first fixing units FXU1 and a second fixing unit FXU2 may be disposed. The first and second fixing units FXU1 and FXU2 may press against both sides of the first window WIN1 opposite to each other in the first direction DR1 to fix the first window WIN1. The control unit CNT may control the movement of the jig portion JGP to align the first window WIN1.

The manufacturing apparatus DMA further includes a fixing unit for fixing the first display panel DP1, and the control unit CNT may control the movement of the fixing unit to align the first display panel DP1.

Hereinafter, a method for manufacturing the display device DD using the manufacturing apparatus DMA, and the functions of the first, second, and third marks MK1, MK2, and MK3 according to the method for manufacturing the display device DD will be described.

Figure 16:
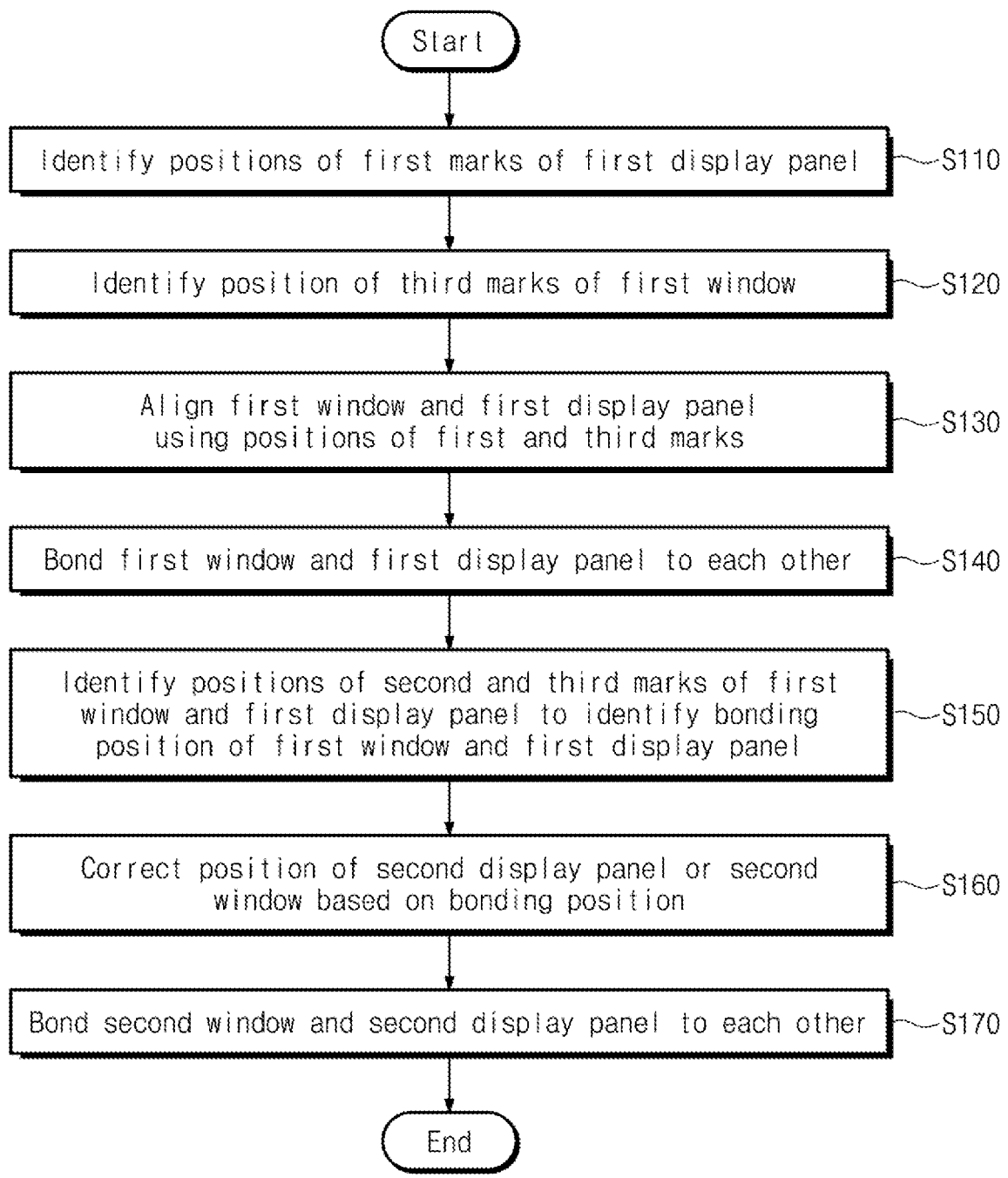
FIG. 16 is a flowchart illustrating an exemplary method for manufacturing a display device according to principles of the invention.

FIG. 16 is a flowchart illustrating an exemplary method for manufacturing a display device according to principles of the invention. FIGS. 17 to 23 are schematic diagrams illustrating the exemplary method for manufacturing the display device.

Figure 17:
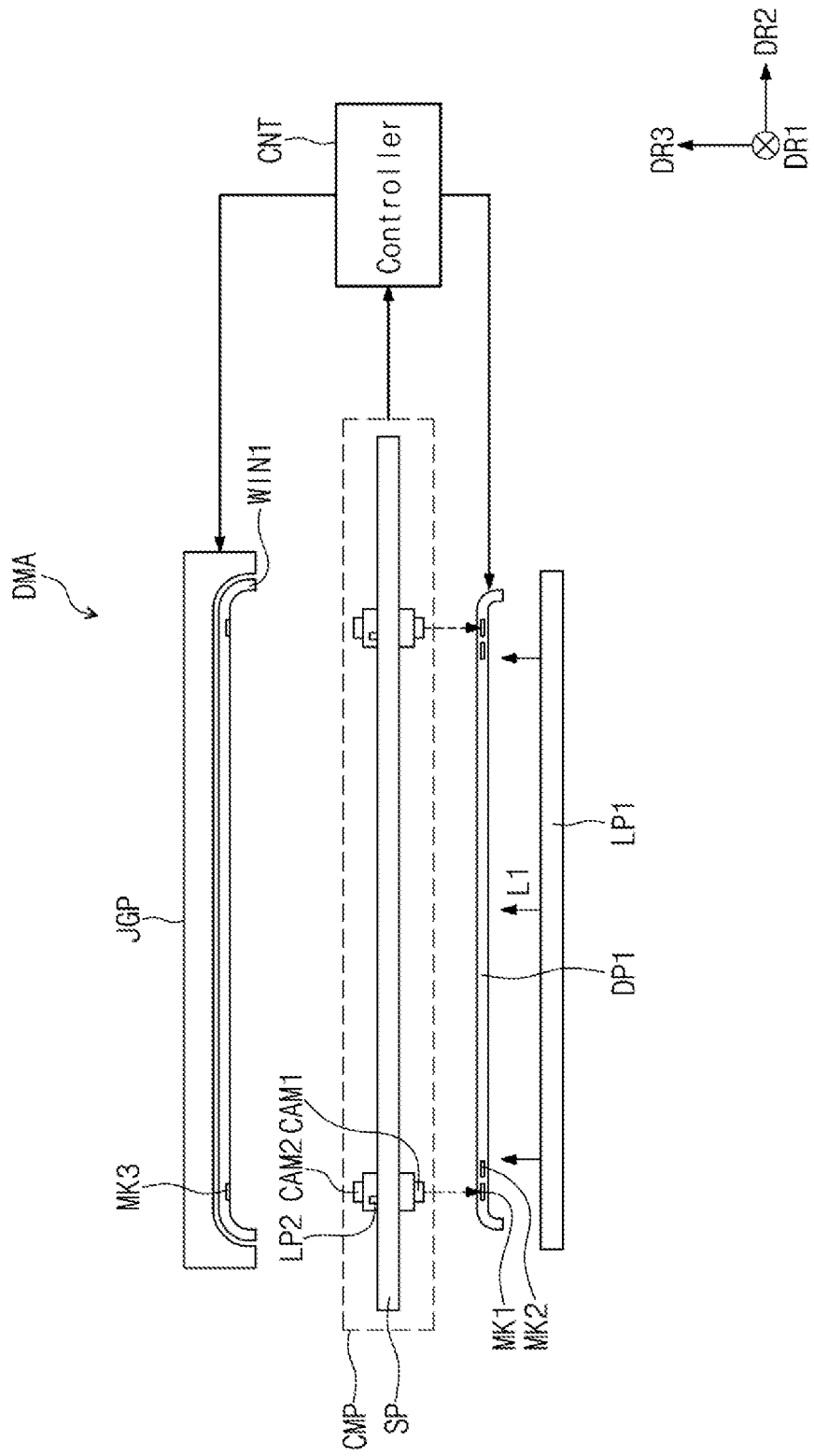
FIGS. 17 to 23 are schematic diagrams illustrating the exemplary method for manufacturing the display device.

Referring to FIG. 16 and FIG. 17, in a step S110, the positions of the first marks MK1 are identified to identify the position of the first display panel DP1. Through the first cameras CAM1 disposed on the first display panel DP1, the positions of the first marks MK1 may be identified.

Particularly, the first lighting LP1 provides first light L1 to the first display panel DP1, and the first cameras CAM1 may capture the first marks MK1. Through the first cameras CAM1, the positions (for examples, coordinates) of the first marks MK1 may be identified. The position information of the first marks MK1 may be provided to the control unit CNT.

Figure 18:
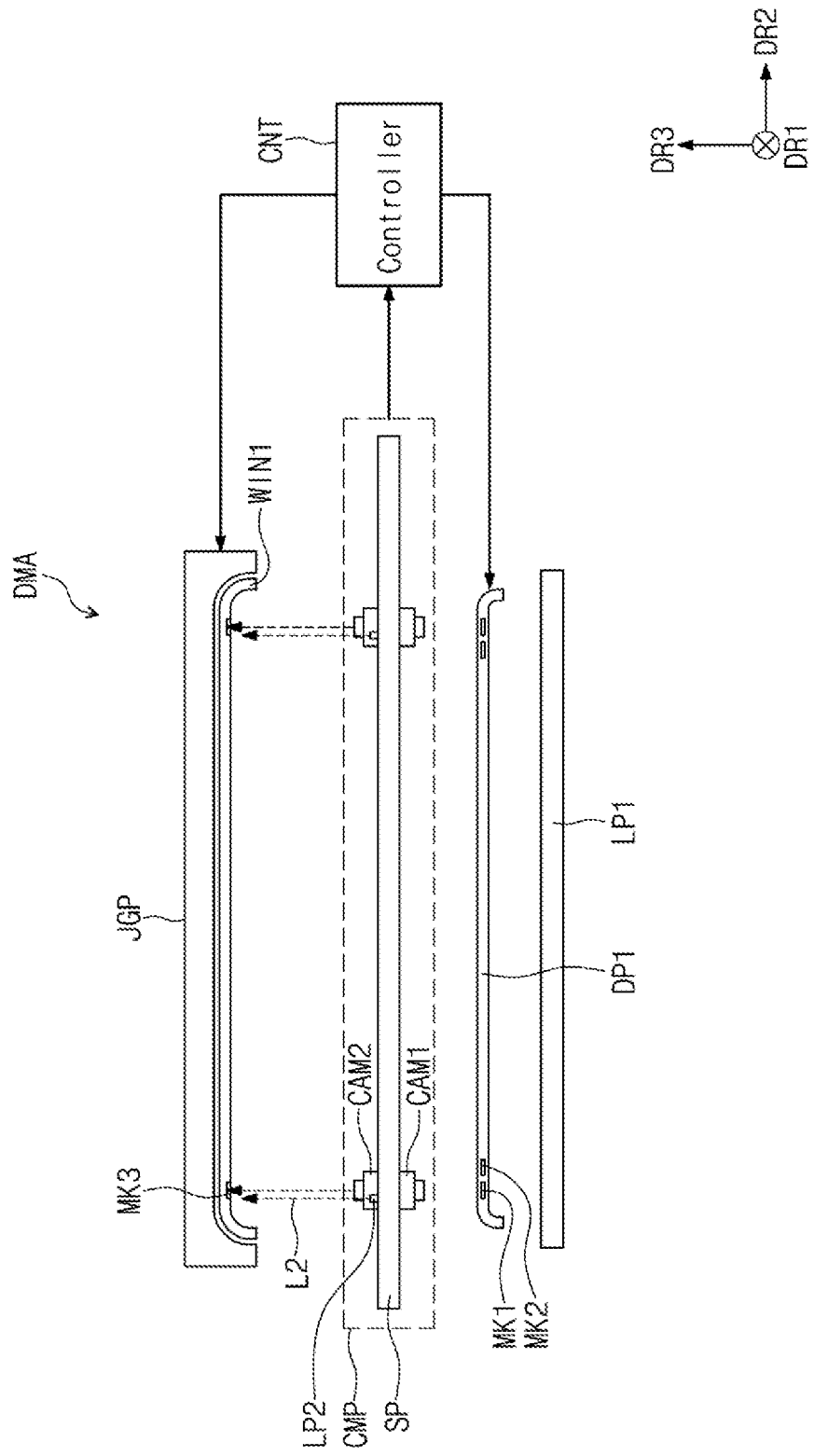

Referring to FIG. 16 and FIG. 18, in a step S120, the positions of the third marks MK3 are identified to identify the position of the first window WIN1. Through the second cameras CAM2 disposed below the first window WIN1, the positions of the third marks MK3 may be identified.

Particularly, the second lightings LP2 provide second light L2 to the first window WIN1, and the second cameras CAM2 may capture the third marks MK3. The second lightings LP2 may be defined as coaxial lightings and may be provided to the first window WIN1 through the second cameras CAM2. Through the second cameras CAM2, the positions (for examples, coordinates) of the third marks MK3 may be identified. The position information of the third marks MK3 may be provided to the control unit CNT.

Figure 19:
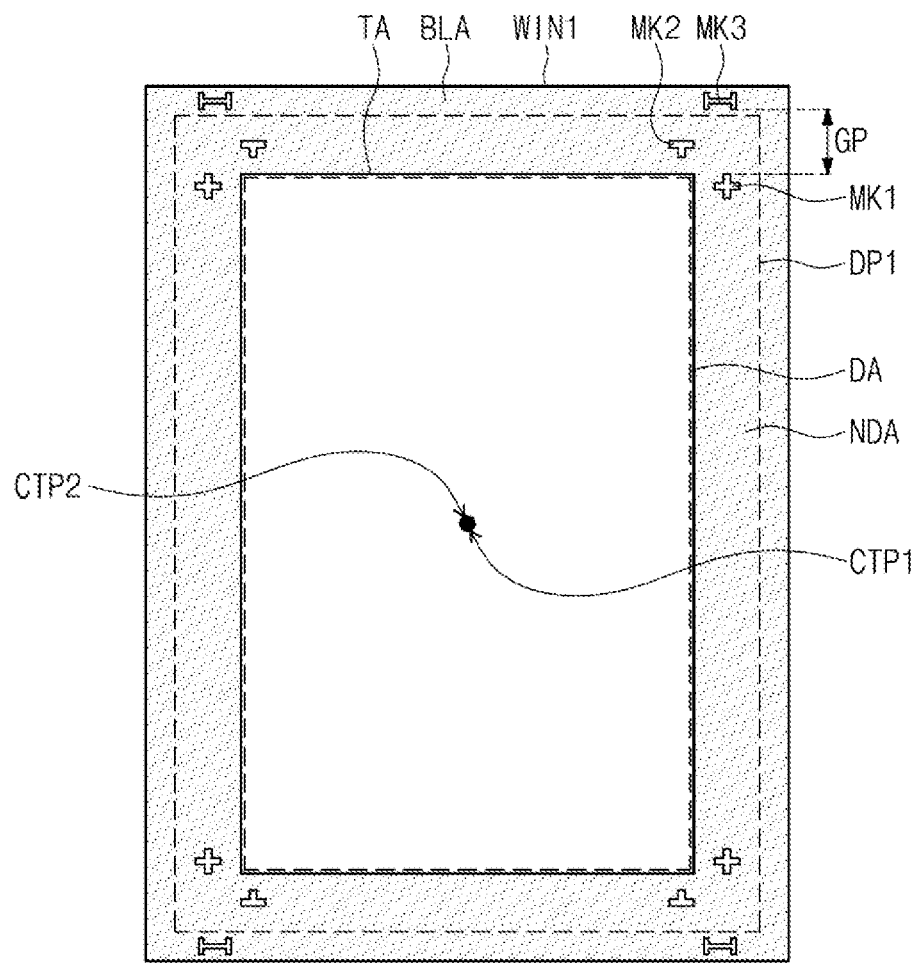

Referring to FIG. 16 and FIG. 19, in a step S130, using the positions of the first and third marks MK1 and MK3, the first window WIN1 and the first display panel DP1 may be aligned. For example, according to the positions of the first and third marks MK1 and MK3, the position of the first display panel DP1 and the position of the first window WIN1 may be identified.

If the first display panel DP1 and the first window WIN1 are not disposed in the correct position relative to each other, the control unit CNT may align the first display panel DP1 and the first window WIN1 in the proper position like the display panel DP and the window WIN shown in FIG. 12. For example, the control unit CNT allows a center point CTP1 of the first display panel DP1 and a center point CTP2 of the first window WIN1 to overlap each other, and may align the first display panel DP1 and the first window WIN1 such that gaps GP between the first marks MK1 and the third marks MK3 adjacent to each other are substantially constant.

Figure 20:
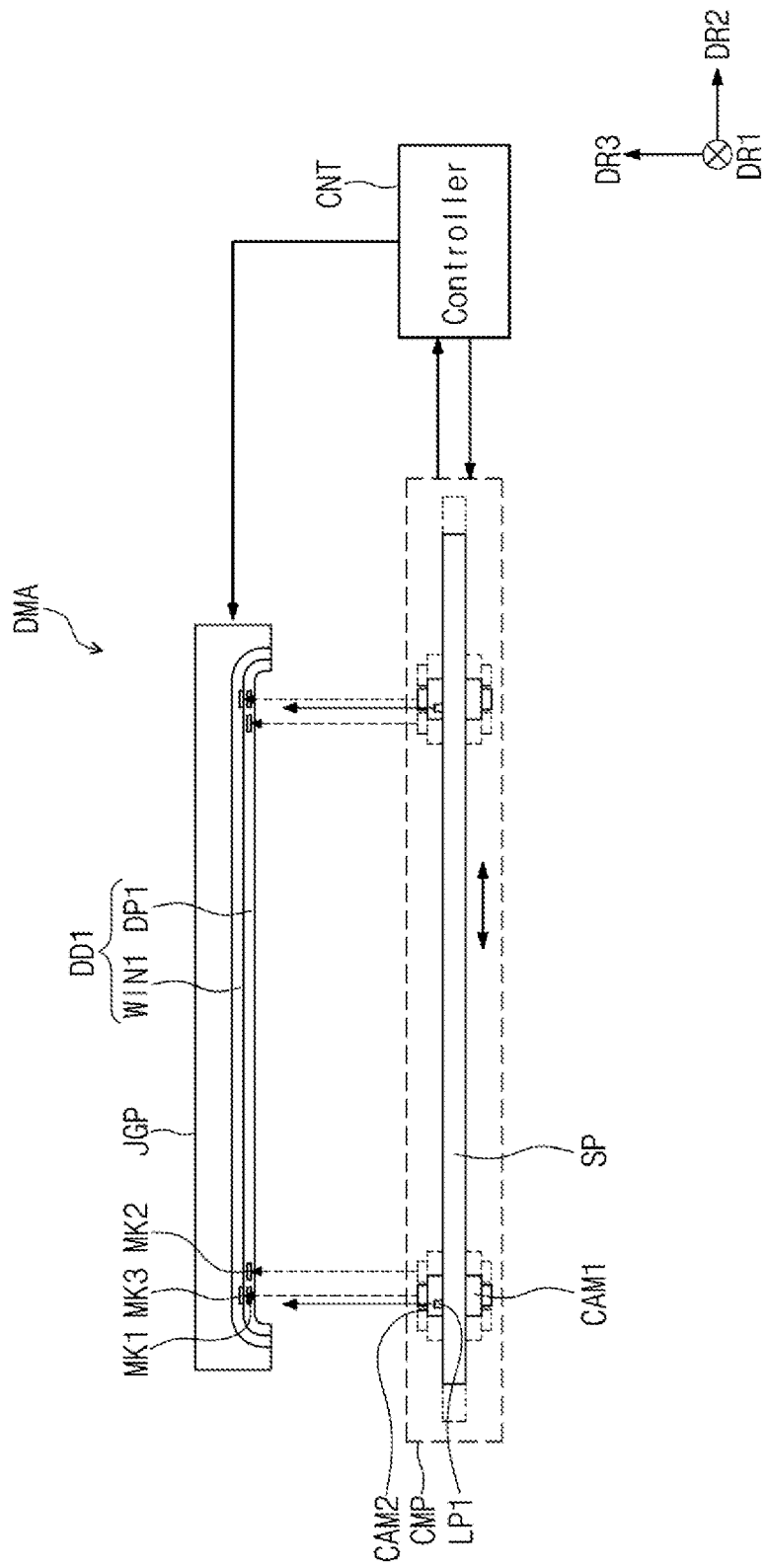

Referring to FIG. 16 and FIG. 20, after the first display panel DP1 and the first window WIN1 are aligned, in a step S140, the first window WIN1 and the first display panel DP1 may be bonded to each other. As described above, the first window WIN1 and the first display panel DP1 may be bonded to each other using the adhesive OCA. The first window WIN1 may be bonded to the first display panel DP1 to manufacture a first display device DD1.

After the first window WIN1 is bonded to the first display panel DP1, in a step S150, the positions of the second and third marks MK2 and MK3 of the first window WIN1 and the first display panel DP1 may be identified to identify a bonding position of the first window WIN1 and the first display panel DP1.

For example, the second cameras CAM2 may be disposed below the first display panel DP1. The second lightings LP2 may provide the second light L2 to the second marks MK2 and the third marks MK3 of the first display panel DP1 and the first window WIN1 bonded to each other. While the camera unit CMP is moving left and right by the control of the control unit CNT, the second cameras CAM2 may capture the second and third marks MK2 and MK3. The second cameras CAM2 may move after capturing the third marks MK3 to capture the second marks MK2.

Through the second cameras CAM2, the positions of the second and third marks MK2 and MK3 of the first display panel DP1 and the first window WIN1 bonded to each other may be identified. The positions of the second and third marks MK2 and MK3 are defined as a bonding position hereinafter. The bonding position information may be provided to the control unit CNT.

Illustratively, using the second cameras CAM2 which have captured the third marks MK3, the second and third marks MK2 and MK3 were captured. However, exemplary embodiments are not limited thereto. Separate cameras may be used to capture the second and third marks MK2 and MK3.

As described above, because the second marks MK2 are disposed lower than the first marks MK1, the second marks MK2 may be closer to the bottom surface of the first display panel DP1. The second cameras CAM2 disposed below the first display panel DP1 may more easily recognize the second marks MK2 which are closer to the bottom surface of the first display panel DP1.

As described with reference to FIG. 12, the third marks MK3 do not overlap the display panel DP and may be disposed at the outer periphery than an edge of the display panel DP. Accordingly, the second light L2 may be provided directly to the third marks MK3 of the first window WIN1 without passing through the first display panel DP1.

If the third marks MK3 overlap the display panel DP, the second light L2 should be provided to the first window WIN1 through the first display panel DP1. However, in this case, some light may be lost due to the first display panel DP1, so that normal second light may not be provided to the first window WIN1, and as a result, the third marks MK3 may not be recognized.

In some exemplary embodiments, because the third marks MK3 do not overlap the display panel DP, the second light L2 may be provided directly to the third marks MK3 of the first window WIN1 without the loss of light.

Illustratively, a process for inspecting the positions of the first display panel DP1 and the first window WIN1 using the first, second, and third marks MK1, MK2, and MK3 has been described. However, the exemplary embodiments are not limited thereto. For example, in order to inspect the positions of the first display panel DP1 and the first window WIN1, the first and third marks MK1 and MK3 may be used instead of using the second marks MK2.

First, the positions of the first marks MK1 may be identified using the first cameras CAM1 to identify the position of the first display panel DP1, and the positions of the third marks MK3 may be identified through the second cameras CAM2 to identify the position of the first window WIN1. Using the positions of the first and third marks MK1 and MK3, the first window WIN1 and the first display panel DP1 are aligned, and the first window WIN1 and the first display panel DP1 may be bonded to each other.

Thereafter, through the second cameras CAM2, the positions of the first and third marks MK1 and MK3 of the first display panel DP1 and the first window WIN1 bonded to each other may be identified. The positions of the first and third marks MK1 and MK3 may be provided as the bonding position information to the control unit CNT.

Figure 21:
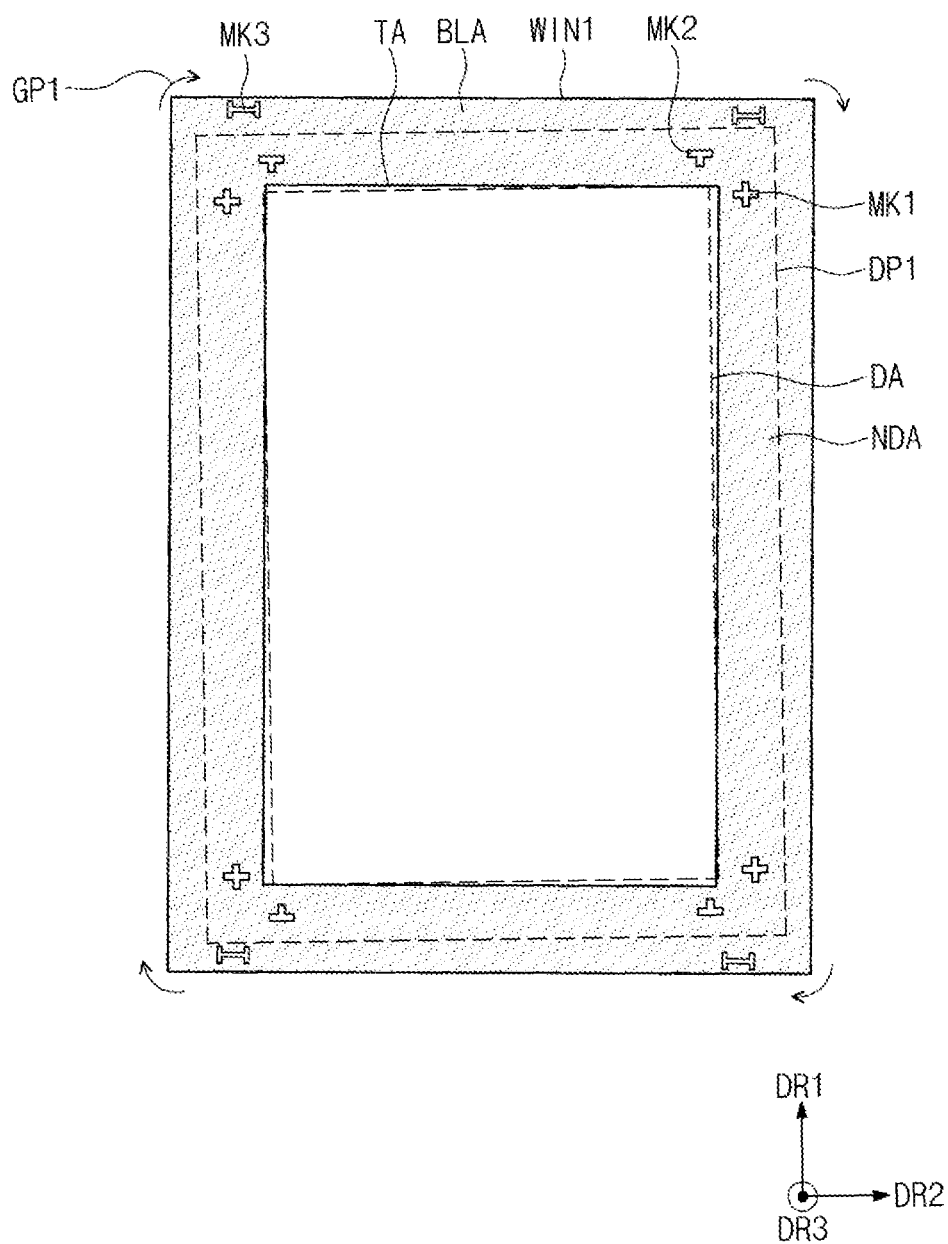

Referring to FIG. 21, the first display panel DP1 and the first window WIN1 aligned in a proper position before being bonded to each other may be mis-aligned out of the proper position due to various factors when the first display panel DP1 and the first window WIN1 are bonded. For example, when the first window WIN1 is bonded to the first display panel DP1, the position of the first window WIN1 may be out of the proper position due to the adhesive OCA having a predetermined fluidity. Not only the position of the first window WIN1, but also the position of the first display panel DP1 may be displaced from the proper position.

Illustratively, in FIG. 21, the misalignment of the first window WIN1, which has been displaced by a first gap GP1 in a clockwise direction is shown. However, the exemplary embodiments are not limited thereto. The first window WIN1 may be mis-aligned out of the proper position in the first direction DR1, or mis-aligned out of the proper position in the second direction DR2. However, the degree of displacement of the first window WIN1 or the first display panel DP1 may be within an error range, in which case the first display device DD1 may be manufactured as a regular product.

However, in some exemplary embodiments, in consideration of the misalignment of the first window WIN1 and the first display panel DP1, the position of the second display panel and the second window may be subsequently more precisely aligned. The above operation will be described in detail with reference to FIG. 22 and FIG. 23 below.

Illustratively, the bonding process of one first display panel DP1 and one first window WIN1 has been described. However, the exemplary embodiments are not limited thereto. The first display panel DP1 and the first window WIN1 may each be provided in K number and bonded for K times. K is a natural number greater than 2.

The bonding position described above may be defined as the average bonding position of K bonding positions measured when the first display panel DP1 and the first window WIN1 are bonded K times. By measuring the bonding positions in a plurality of bonding processes, as opposed to just one, more accurate misalignment may be identified.

Figure 22:
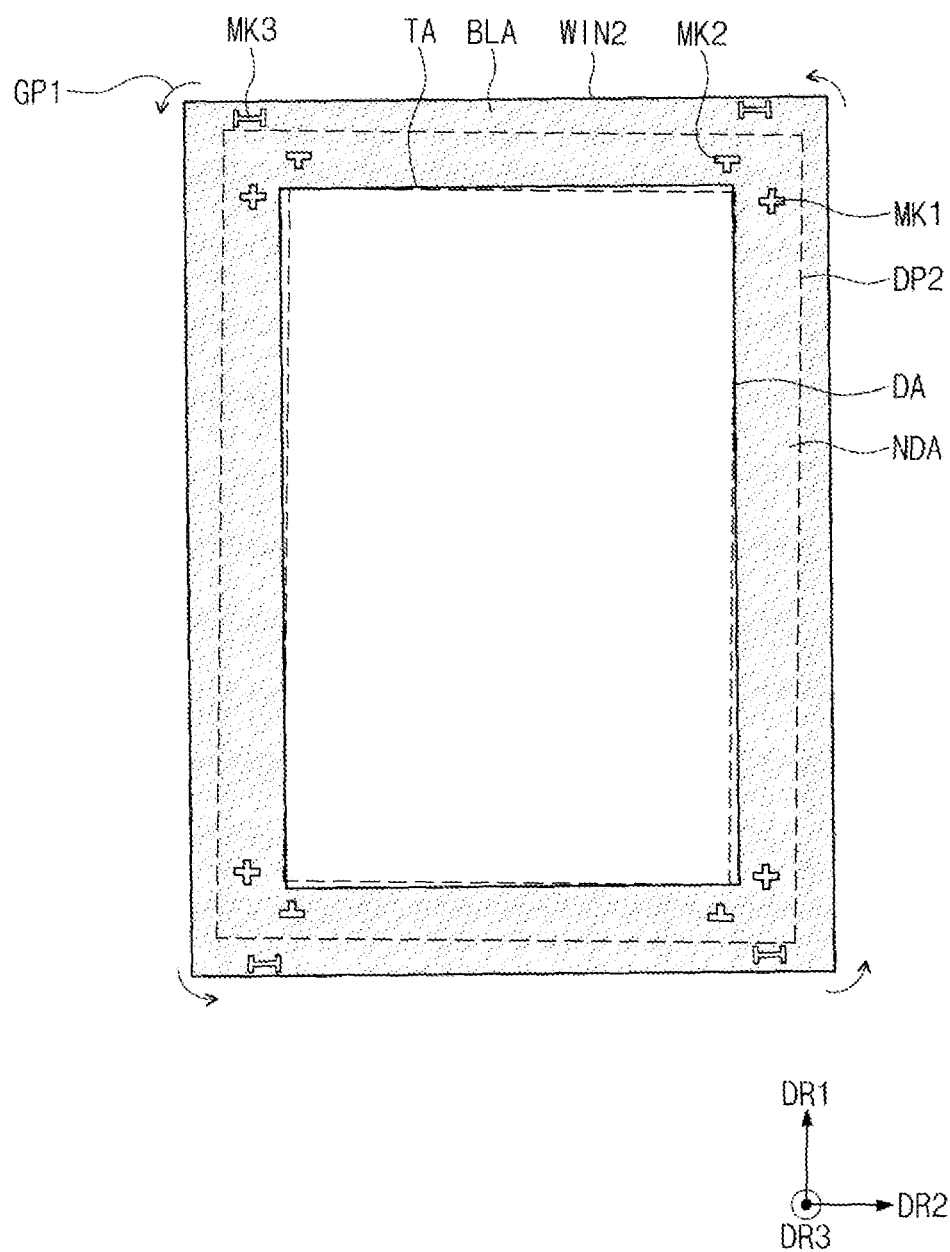

Referring to FIG. 16 and FIG. 22, in a step S160, the position of a second display panel DP2 or the position of a second window WIN2 may be compensated for based on the bonding position information of the first display panel DP1 and the first window WIN1. The second display panel DP2 and the second window WIN2 may have the same configurations as the display panel DP and the window WIN shown in FIG. 3 and FIG. 9.

Specifically, referring to FIG. 21, when the first display panel DP1 and the first window WIN1 are bonded to each other, the first window WIN1 may move by the first gap GP1 in the clockwise direction with respect to the first display panel DP1. The control unit CNT may calculate the displacement amount of the first window WIN1 using the bonding position information.

For example, of the first display panel DP1 and the first window WIN1 bonded to each other, the control unit CNT may set the position of the first display panel DP1 as a reference position. The control unit CNT may calculate the displacement amount of the first window WIN1 which was moved based on the reference position. In FIG. 21, the displacement amount may be the first gap GP1 which is a movement gap of the first window WIN1 which has been moved in the clockwise direction. Therefore, whenever the bonding process is performed, it can be seen that the first window WIN1 moves by the first gap GP1 with respect to the first display panel DP1.

Illustratively, an operation in which the position of the first display panel DP1 is set as the reference position to calculate the displacement amount of the first window WIN1 based on display panel DP1 has been described. However, the exemplary embodiments are not limited thereto. The position of the first window WIN1 may be set as the reference position to calculate the displacement amount of the first display panel DP1 based on the first window WIN1.

Referring back to FIG. 22, whenever the bonding process is performed, the first window WIN1 moves by the first gap GP1. Therefore, during the bonding process of the second window WIN2 and the second display panel DP2, the control unit CNT may correct the position of the second window WIN2 to a reverse position by the displacement amount of the first window WIN1.

The position of the second display panel DP2 and the position of the second window WIN2 may be identified by capturing the first marks MK1 of the second display panel DP2 and the third marks MK3 of the second window WIN2 with the above-described first cameras CAM1 and the second cameras CAM2. In order to set the position of the second display panel DP2 as the reference position, the second display panel DP2 may be fixed.

Based on the position of the second display panel DP2, the position of the second window WIN2 may be corrected to a reverse position by the displacement amount of the first window WIN1. For example, by the control of the control unit CNT, the second window WIN2 may move by the first gap GP1 in the counterclockwise direction with respect to the second display panel DP2 and disposed.

Illustratively, an operation in which the position of the second window WIN2 is corrected based on the position of the second display panel DP2 has been described. However, the exemplary embodiments are not limited thereto. The position of the second window WIN2 may be set as the reference position to correct the position of the second display panel DP2 based on the second window WIN2.

When the first window WIN1 is mis-aligned out of the proper position in the first direction DR1, the position of the second window WIN2 may be corrected by the displacement amount of the first window WIN1 in the first direction DR1 based on the position of the second display panel DP2. In addition, when the first window WIN1 is mis-aligned out of the proper position in the second direction DR2, the position of the second window WIN2 may be corrected by the displacement amount of the first window WIN1 in the second direction DR2 based on the position of the second display panel DP2.

Figure 23:
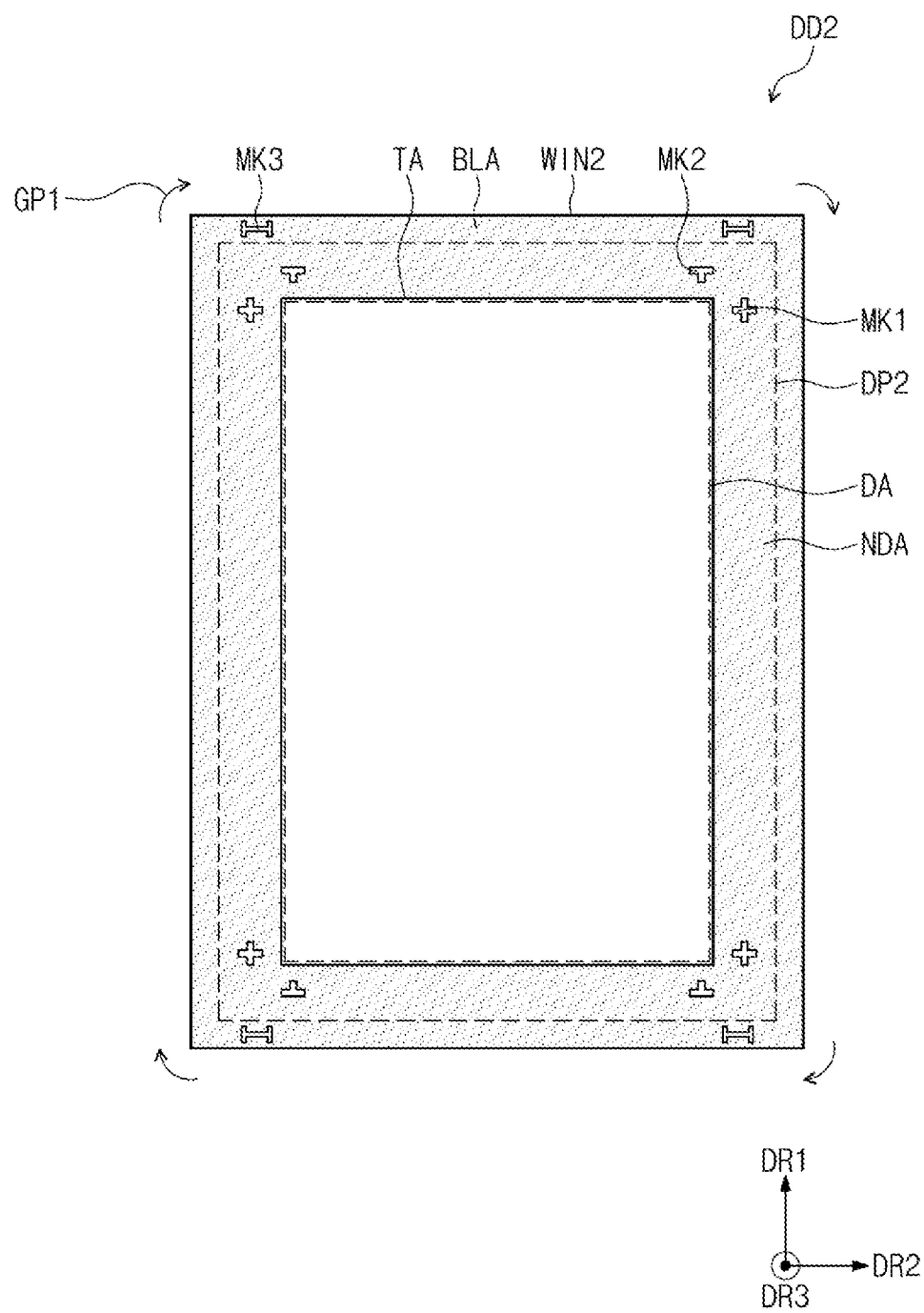

Referring to FIG. 16 and FIG. 23, in a step S170, the second window WIN2 and the second display panel DP2 may be bonded to each other. The process in which the second window WIN2 is bonded to the second display panel DP2 may be the same as the process in which the first window WIN1 is bonded to the first display panel DP1. Accordingly, the second window WIN2 may also move by the first gap GP1 in the clockwise direction.

However, since the second window WIN2 has been already moved by the first gap GP1 in the counterclockwise direction, when the second window WIN2 moves by the first gap GP1 in the clockwise direction during the bonding process, the second window WIN2 may be disposed in a further proper position and bonded to the second display panel DP2.

The second window WIN2 may be bonded to the second display panel DP2 to manufacture a second display device DD2. In the second display device DD2, the alignment accuracy of the second window WIN2 and the second display panel DP2 may be further improved. The second display device DD2 may be the display device DD.

As a result, the display device DD may have improved alignment accuracy of the display panel DP and the window WIN.

Although the bonding process of one second display panel DP2 and one second window WIN2 has been exemplarily described, the second display panel DP2 and the second window WIN2 each may be provided in L number and bonded for L times. L is a natural number greater than K.

After performing the bonding process for L times, a process for inspecting the bonding position may be performed for K times as in the case of the first display panel DP1 and the first window WIN1. During the L times of bonding processes, the alignment error of processing facilities may occur. Therefore, another process for inspecting the bonding position may be performed, and then the bonding process may be performed for L times as in the case of the second display panel DP2 and the second window WIN2.

Figure 24:
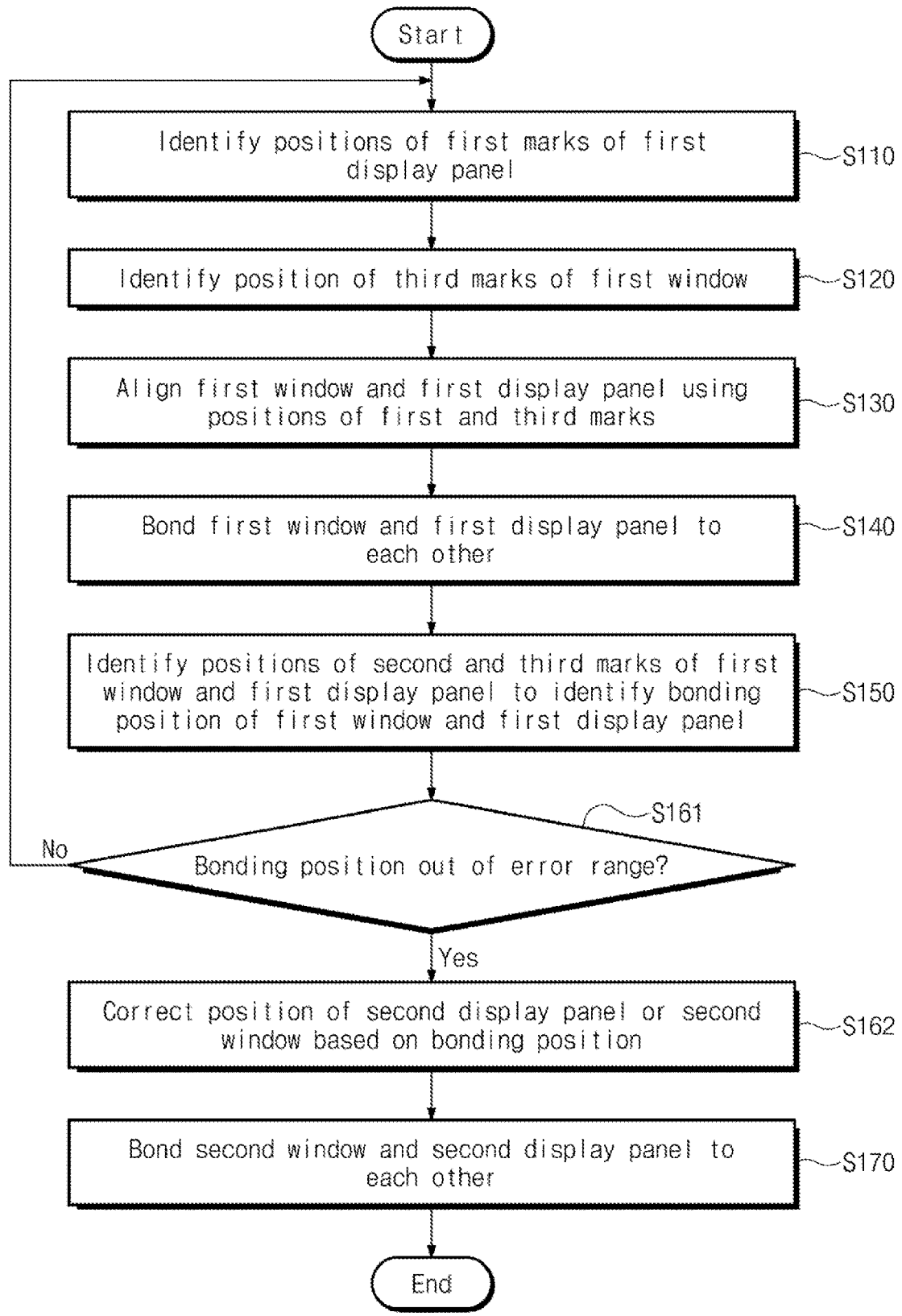
FIG. 24 is a flowchart illustrating another exemplary method for manufacturing a display device according to principles of the invention.

FIG. 24 is a flowchart illustrating another exemplary method for manufacturing a display device according to principles of the invention. Hereinafter, focusing on a method different from the method for manufacturing the display device shown in FIG. 16, the method for manufacturing the display device shown in FIG. 24 will be described.

Referring to FIG. 24, a bonding process for a plurality of first display panels DP1 and a plurality of first windows WIN1 may be repeatedly performed. A bonding process for a pair of the first display panel DP1 and the first window WIN1 may be repeatedly performed from the step S110 to a step S161. Since the step S110 to the step S150 have been described in detail above, the description thereof will be omitted to avoid redundancy.

In the step S161, the first window WIN1 and the first display panel DP1 may be inspected whether the bonding position thereof is within an error range. When the bonding position of the first window WIN1 and the first display panel DP1 is within an error range, the display device is determined to be a good product, so that a manufacturing step of the display device is terminated, and an additional position correction operation may not be required. Accordingly, when the bonding position of the first window WIN1 and the first display panel DP1 is within an error range, the step S110 will be followed, and a bonding process of the next first display panel DP1 and the next first window WIN1 may be performed.

When the bonding position of the first window WIN1 and the first display panel DP1 is within an error range, the bonding process for the plurality of first display panels DP1 and the plurality of first windows WIN1 may be repeatedly performed. For example, the bonding process may be performed for L times.

While the bonding position for the plurality of the first display panel DP1 and the plurality of the first window WIN1 is being repeatedly performed, in the L-th time bonding process, the bonding position of the first window WIN1 and the first display panel DP1 may be deviate from the error range. In this case, the first window WIN1 and the first display panel DP1 may be determined as defective products and discarded.

Thereafter, a step S162 is followed, and the position of the second display panel DP2 or the position of the second window WIN2 may be compensated based on the bonding position information of the first display panel DP1 and the first window WIN1. The compensation operation has been described in detail above, and therefore, the description thereof will be omitted to avoid redundancy.

Figure 25:
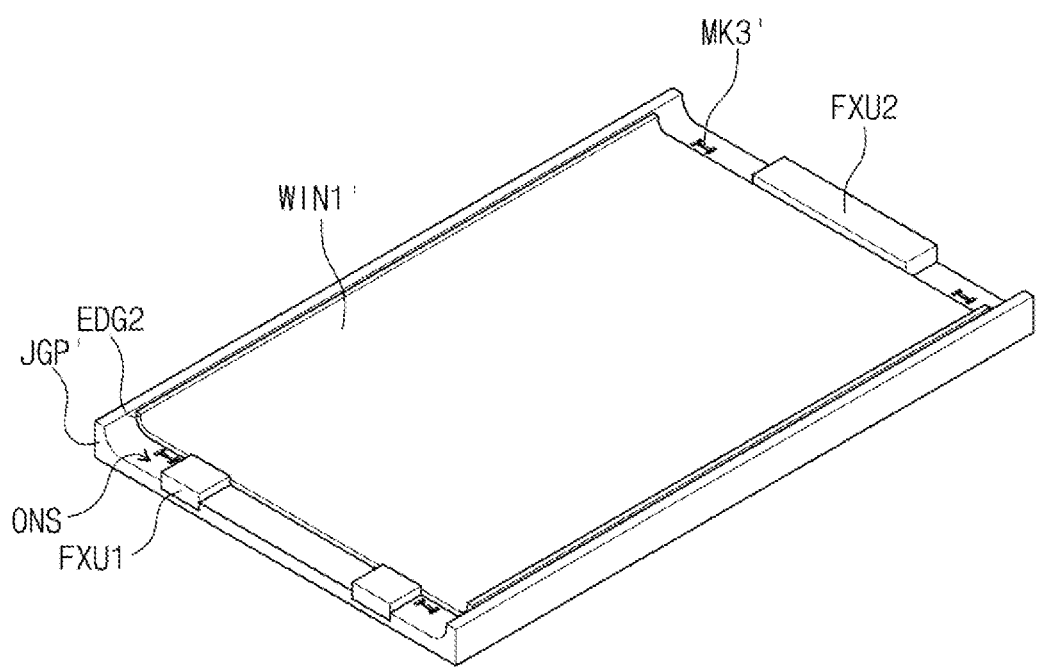
FIG. 25 is a perspective view illustrating another exemplary embodiment of a jig portion constructed according to principles of the invention.
Figure 25:
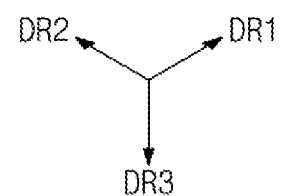
Figure 26:
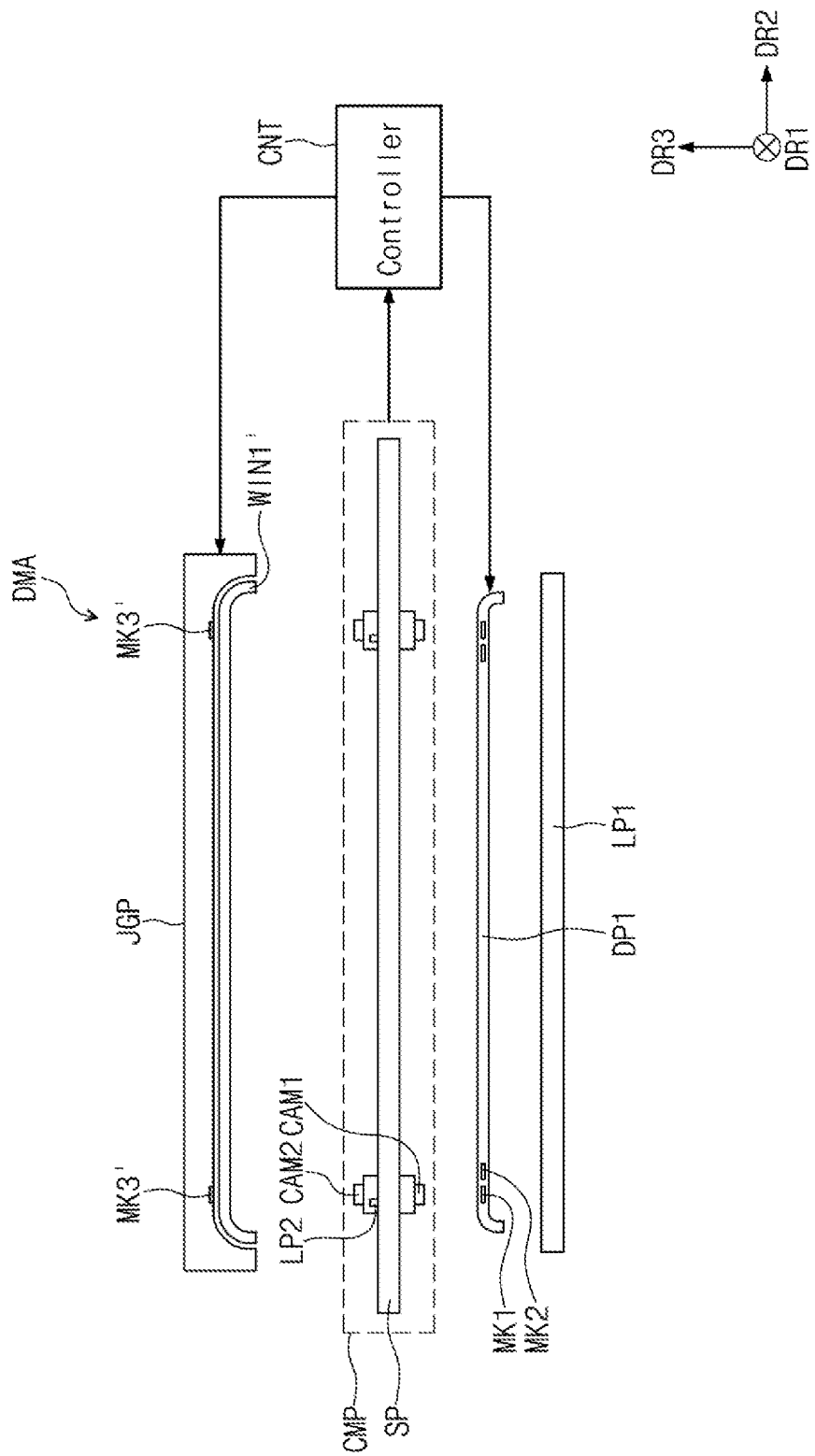
FIG. 26 is a schematic diagram of the jig portion shown in FIG. 25 viewed from a first direction.

FIG. 25 is a perspective view illustrating another exemplary embodiment of a jig portion constructed according to principles of the invention. FIG. 26 is a schematic diagram of the jig portion shown in FIG. 25 viewed from a first direction.

In FIG. 26, for convenience of description, third marks MK3' are shown together with a jig portion JGP'. Hereinafter, those aspects of the configuration of the jig portion JGP' shown in FIG. 26 that are different from the configuration of the jig portion JGP shown in FIG. 15 will be mainly described.

Referring to FIG. 25 and FIG. 26, a first window WIN1' may be disposed on one surface ONS of the jig portion JGP'. The jig portion JGP' may include a plurality of third marks MK3' disposed on the one surface ONS. The third marks MK3' may be disposed substantially aligned with the outer periphery of the first window WIN1', as depicted in FIG. 26. The third marks MK3' may be formed in an engraved pattern, but are not limited thereto, and may be formed in an embossed pattern.

The third marks MK3' may not overlap the first and second marks MK1 and MK2 as in the case of the third marks MK3 and may have different shapes from the first and second marks MK1 and MK2. The third marks MK3' may have, for example, the general shape of "I."

The jig portion JGP' includes the third marks MK3', and the first window WIN1' may not include the third marks MK3. Since the first window WIN1' is fixed to the jig portion JGP' and moved by the jig portion JGP', through the third marks MK3' of the jig portion JGP', the position of the first window WIN1' may be identified. That is, using the third marks MK3' instead of the third marks MK3, the position of the first window WIN1' may be identified. Other components and processes are the same as those described above, and thus, the description thereof will be omitted to avoid redundancy.

Some of the advantages that may be achieved by exemplary implementations of the invention and/or exemplary methods of the invention include, depending on the bonding position of a first window and a first display panel which are bonded to each other, the position of a second display panel or the position of a second window is compensated, so that the second display panel and the second window may be bonded to each other. As a result, the alignment accuracy of a display panel and a window may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device defining a longitudinal direction, a width direction perpendicular to the longitudinal direction, and a thickness direction perpendicular to the longitudinal and width directions, and comprising:
   a display panel, including:
      a display region including a plurality of pixels;
      a non-display region around the display region; and
      a first indicia and a second indicia disposed in the non-display region, the first indicia and the second indicia separated and spaced apart from each other when viewed in a plan view; and
   a window disposed on the display panel and, including:
      a transmission region overlapping the display region;
      a light blocking region overlapping the non-display region; and
      a third indicia disposed in the light blocking region;
   wherein when viewed in a plan view, the third indicia disposed in the light blocking region does not overlap with the first indicia and the second indicia separated from each other in the non-display region, and
   wherein the third indicia does not overlap the display panel in the thickness direction.

2. The display device of claim 1, wherein the third indicia is disposed outside the first indicia and the second indicia.

3. The display device of claim 1, wherein the third indicia is disposed at an outer periphery spaced apart from an edge of the display panel.

4. The display device of claim 1, wherein the first indicia, the second indicia, and the third indicia have different shapes.

5. The display device of claim 1, wherein at least one of the pixels comprises:
   a transistor disposed on a substrate and including a gate electrode, a source electrode, and a drain electrode, and a semiconductor layer; and
   a light emitting element connected to the transistor.

6. The display device of claim 5, wherein the first indicia is formed of the same material as the gate electrode and disposed on the same layer as the gate electrode.

7. The display device of claim 1, wherein the first indicia and the second indicia comprise first and second marks, respectively, formed in an engraved pattern.

8. The display device of claim 1, wherein the window further comprises:
   a window film including the transmission region and the light blocking region; and
   a print layer disposed below the light blocking region.

9. The display device of claim 8, wherein the third indicia is disposed in the print layer.

10. The display device of claim 9, wherein the third indicia comprises a third mark formed in an engraved pattern on the print layer.

11. The display device of claim 8, wherein the third indicia is disposed in the window film.

12. The display device of claim 11, wherein the third indicia comprises a third mark formed in an engraved pattern on the window film.

13. The display device of claim 11, wherein the third indicia comprises a third mark formed in an embossed pattern.

14. The display device of claim 1, wherein first edge portions defined by both sides of the first display panel and second edge portions defined by both sides of the first window are generally curved, the first indicia and the second indicia do not overlap the first edge portions, and the third indicia does not overlap the second edge portions.

15. The display device of claim 1, wherein the first indicia and the third indicia each comprise plural indicia, when the display panel and the window are aligned with each other, gaps between adjacent pairs of the first indicia and the third indicia are substantially constant.

16. A display device comprising:
   a display panel, including:
      a display region including a plurality of pixels;
      a non-display region around the display region; and
      a first indicia and a second indicia disposed in the non-display region, the first indicia and the second indicia separated and spaced apart from each other when viewed in a plan view; and
   a window disposed on the display panel and, including:
      a transmission region overlapping the display region;

a light blocking region overlapping the non-display region; and a third indicia disposed in the light blocking region;

wherein when viewed in a plan view, the third indicia disposed in the light blocking region does not overlap with the first indicia and the second indicia separated from each other in the non-display region;

wherein at least one of the pixels comprises:

a transistor disposed on a substrate and including a gate electrode, a source electrode, and a drain electrode, and a semiconductor layer; and a light emitting element connected to the transistor, wherein the first indicia is formed of the same material as the gate electrode and disposed on the same layer as the gate electrode, and wherein the second indicia is formed of the same material as the semiconductor layer and disposed on the same layer as the semiconductor layer.

17. The display device of claim 16, wherein the second indicia is disposed at a level lower in the display device than the first indicia.

18. The display device of claim 16, wherein the first indicia and the second indicia comprise first and second marks, respectively, formed in an embossed pattern.

19. The display device of claim 6, A display device comprising:

a display panel, including:

a display region including a plurality of pixels;

a non-display region around the display region; and a first indicia and a second indicia disposed in the non-display region, the first indicia and the second indicia separated and spaced apart from each other when viewed in a plan view; and a window disposed on the display panel and, including:

a transmission region overlapping the display region;

a light blocking region overlapping the non-display region; and a third indicia disposed in the light blocking region;

wherein when viewed in a plan view, the third indicia disposed in the light blocking region does not overlap with the first indicia and the second indicia separated from each other in the non-display region;

wherein at least one of the pixels comprises:

a transistor disposed on a substrate and including a gate electrode, a source electrode, and a drain electrode, and a semiconductor layer; and a light emitting element connected to the transistor, wherein the first indicia is formed of the same material as the gate electrode and disposed on the same layer as the gate electrode, and wherein the second indicia is formed of the same material as the source and drain electrodes and disposed on the same layer as the source and drain electrodes.

20. A display device defining a longitudinal direction, a width direction perpendicular to the longitudinal direction, and a thickness direction perpendicular to the longitudinal and width directions, and comprising:

a display panel, including:

a display region;

a non-display region around the display region; and a first indicia and a second indicia disposed in the non-display region, the first indicia and the second indicia separated and spaced apart from each other when viewed in a plan view; and a window disposed on the display panel and, including:

a transmission region overlapping the display region;

a light blocking region overlapping the non-display region; and a third indicia disposed in the light blocking region;

wherein, when viewed in a plan view, the third indicia is disposed at an outer periphery spaced apart from an edge of the display panel, wherein when viewed in a plan view, the third indicia disposed in the light blocking region does not overlap with the first indicia and the second indicia separated from each other in the non-display region, and wherein the third indicia does not overlap the display panel in the thickness direction.

* * * * *